US008385469B2

(12) United States Patent
Wang et al.

(10) Patent No.: US 8,385,469 B2
(45) Date of Patent: Feb. 26, 2013

(54) HIGH-EFFICIENCY ALL-DIGITAL TRANSMITTER

(75) Inventors: Hua Wang, San Jose, CA (US); Toru Matsuura, Osaka (JP); Gregoire le Grand de Mercey, San Jose, CA (US); Paul Cheng-Po Liang, Santa Clara, CA (US); Koji Takinami, Saratoga, CA (US); Richard W. D. Booth, San Jose, CA (US)

(73) Assignee: Panasonic Corporation, Osaka (JP)

( * ) Notice: Subject to any disclaimer, the term of this patent is extended or adjusted under 35 U.S.C. 154(b) by 445 days.

(21) Appl. No.: 12/690,870

(22) Filed: Jan. 20, 2010

(65) Prior Publication Data
US 2011/0176636 A1 Jul. 21, 2011

(51) Int. Cl.
*H03C 3/00* (2006.01)
(52) U.S. Cl. ...................................... 375/302; 455/127.2
(58) Field of Classification Search ......................... None
See application file for complete search history.

(56) References Cited

U.S. PATENT DOCUMENTS

| | | | |
|---|---|---|---|
| 2004/0013190 A1* | 1/2004 | Jayaraman et al. | 375/233 |
| 2008/0021704 A1* | 1/2008 | Thumpudi et al. | 704/230 |
| 2008/0051044 A1* | 2/2008 | Takehara | 455/127.2 |
| 2009/0004981 A1 | 1/2009 | Eliezer et al. | |
| 2009/0311980 A1* | 12/2009 | Sjoland | 455/127.3 |

OTHER PUBLICATIONS

PCT Application No. PCT/US2011/21702 International Search Report, dated Mar. 21, 2011, 2 pages.
Yamaji, Takafumi et al., "A Digital-to-RF Converter Architecture Suitable for a Digital-to-RF Direct-Conversion Software Defined Radio Transmitter", IEICE Trans Commun. vol. E83-B, No. 6, Jun. 2000, pp. 1254-1260.
Jerng, Albert et al., "A Wideband Delta Sigma Digital-RF Modulator with Self-Tuned RF Bandpass Reconstruction Filter", IEEE 2006 Custom Integrated Circuits Conference, pp. 125-128.
Wang, Yuanxun, "A Class-S RF Amplifier Architechture with Envelope Delta-Sigma Modulation", 2002 IEEE, Dept. of EE, UCLA, Los Angeles, CA, pp. 177-180.

* cited by examiner

*Primary Examiner* — Leon-Viet Nguyen

(57) ABSTRACT

A low cost high-efficiency all-digital transmitter using all-digital power amplifiers ("DPA") and various mapping techniques to generate an output signal, which substantially reproduces a baseband signal at a carrier frequency. A baseband signal generator generates a baseband signal which is quantized by a signal processor using a quantization map. A DPA control mapper outputs control signals to phase selectors using the quantized signal and a quantization table. Each phase selector receives one of the control signals and outputs a waveform at a carrier frequency with a phase corresponding to the control signals, or an inactive signal. Each DPA in a DPA array has an assigned weight, receives one of the waveforms from the phase selectors, and outputs a power signal according to the weight of the DPA and the phase of the received waveform. The combined power signal substantially reproduces the baseband signal at the carrier frequency.

13 Claims, 42 Drawing Sheets

Control Signal Table for Equal-Weight Mapping

| C_i | 0 | 1 | 2 | 3 | 4 | 5 | 6 | 7 | 8 |
|---|---|---|---|---|---|---|---|---|---|
| Phase | off | 0° | θ | 2θ | 3θ | 4θ | 5θ | 6θ | 7θ |

FIG. 10

Equal-Weight Quantization Table

| Quantization Point | Control Signal for Each Phase Selector | | | | | |
|---|---|---|---|---|---|---|
| (I_ΔΣ, Q_ΔΣ) | C_1 | C_2 | C_3 | C_4 | C_5 | C_6 |
| (0, 0) | 0 | 0 | 0 | 0 | 0 | 0 |
| (1, 0) | 1 | 0 | 0 | 0 | 0 | 0 |
| (0.7, 0.7) | 0 | 2 | 0 | 0 | 0 | 0 |
| (2, 0) | 1 | 1 | 0 | 0 | 0 | 0 |
| (1.7, 0.7) | 1 | 2 | 0 | 0 | 0 | 0 |
| (1.4, 1.4) | 2 | 2 | 0 | 0 | 0 | 0 |
| (6, 0) | 1 | 1 | 1 | 1 | 1 | 1 |
| (5.4, 1.4) | 1 | 1 | 1 | 1 | 2 | 2 |
| (4.2, 4.2) | 2 | 2 | 2 | 2 | 2 | 2 |

FIG. 11

Equal-Weight Quantization Table

| Quantization Point | Control Signal for Each Phase Selector | | | | | |
|---|---|---|---|---|---|---|
| $(I\_\Delta\Sigma, Q\_\Delta\Sigma)$ | C_1 | C_2 | C_3 | C_4 | C_5 | C_6 |
| (6, 0) | 1 | 1 | 1 | 1 | 1 | 1 |
| (4.2, 4.2) | 2 | 2 | 2 | 2 | 2 | 2 |
| (0, 6) | 3 | 3 | 3 | 3 | 3 | 3 |
| (-4.2, 4.2) | 4 | 4 | 4 | 4 | 4 | 4 |
| (-6, 0) | 5 | 5 | 5 | 5 | 5 | 5 |
| (-4.2, -4.2) | 6 | 6 | 6 | 6 | 6 | 6 |
| (0, -6.0) | 7 | 7 | 7 | 7 | 7 | 7 |
| (4.2, -4.2) | 8 | 8 | 8 | 8 | 8 | 8 |

*FIG. 13*

Equal-Weight Quantization Table

| Quantization Point | Control Signal for Each Phase Selector | | | | | |
|---|---|---|---|---|---|---|
| (I_ΔΣ, Q_ΔΣ) | C_1 | C_2 | C_3 | C_4 | C_5 | C_6 |
| (4.1, 2.1) | 1 | 1 | 2 | 2 | 2 | 0 |
| (2.1, 3.1) | 2 | 2 | 2 | 3 | 0 | 0 |
| (-2.1, 4.1) | 3 | 3 | 4 | 4 | 4 | 0 |
| (-3.7, 0.7) | 4 | 5 | 5 | 5 | 0 | 0 |
| (-3.4, 1.4) | 5 | 5 | 6 | 6 | 0 | 0 |
| (-2.1, -4.1) | 6 | 6 | 6 | 7 | 7 | 0 |
| (0.7, -3.7) | 7 | 7 | 7 | 8 | 0 | 0 |
| (2.7, -0.7) | 8 | 1 | 1 | 0 | 0 | 0 |

*FIG. 15*

Control Signal Table for Binary-Weight Mapping

| C_i   | 0   | 1  | 2 | 3  | 4  | 5  | 6  | 7  | 8  |
|-------|-----|----|---|----|----|----|----|----|----|
| Phase | off | 0° | θ | 2θ | 3θ | 4θ | 5θ | 6θ | 7θ |

FIG. 23

Binary-Weight Quantization Table

| Quantization Point | Control Signal for Each Phase Selector | | |
|---|---|---|---|
| $(I\_\Delta\Sigma, Q\_\Delta\Sigma)$ | C_1 (DPA) weight = 1) | C_2 (DPA) weight = 2) | C_3 (DPA) weight = 4) |
| (0, 0) | 0 | 0 | 0 |
| (1, 0) | 1 | 0 | 0 |
| (0.7, 0.7) | 2 | 0 | 0 |
| (3, 0) | 1 | 1 | 0 |
| (2.7, 0.7) | 2 | 1 | 0 |
| (2.4, 1.4) | 1 | 2 | 0 |
| (7, 0) | 1 | 1 | 1 |
| (6.4, 1.4) | 1 | 2 | 1 |
| (4.9, 4.9) | 2 | 2 | 2 |

FIG. 24

Binary-Weight Quantization Table

| Quantization Point | Control Signal for Each Phase Selector | | |
|---|---|---|---|
| ($I\_\Delta\Sigma$, $Q\_\Delta\Sigma$) | C_1 (DPA) weight = 1) | C_2 (DPA) weight = 2) | C_3 (DPA) weight = 4) |
| (7, 0) | 1 | 1 | 1 |
| (4.9, 4.9) | 2 | 2 | 2 |
| (0, 7) | 3 | 3 | 3 |
| (-4.9, 4.9) | 4 | 4 | 4 |
| (-7, 0) | 5 | 5 | 5 |
| (-4.9, -4.9) | 6 | 6 | 6 |
| (7, 0) | 7 | 7 | 7 |
| (4.9, -4.9) | 8 | 8 | 8 |

*FIG. 26*

Binary-Weight Quantization Table

| Quantization Point | Control Signal for Each Phase Selector | | |
|---|---|---|---|
| ($I\_\Delta\Sigma$, $Q\_\Delta\Sigma$) | C_1 (DPA) weight = 1) | C_2 (DPA) weight = 2) | C_3 (DPA weight = 4) |
| (5.4, 1.4) | 0 | 2 | 1 |
| (1.4, 5.4) | 0 | 2 | 3 |
| (-0.7, 4.7) | 4 | 0 | 3 |
| (-2.4, 1.4) | 5 | 4 | 0 |
| (-6.7, 0.7) | 6 | 5 | 5 |
| (-0.7, -2.7) | 6 | 7 | 0 |
| (2.8, -4.8) | 0 | 7 | 8 |
| (3.8, -2.8) | 1 | 0 | 8 |

*FIG. 28*

Control Signal Table for Arbitrary-Weight Mapping

| C_i   | 0   | 1  | 2 | 3  | 4  | 5  | 6  | 7  | 8  |
|-------|-----|----|---|----|----|----|----|----|----|
| Phase | off | 0° | θ | 2θ | 3θ | 4θ | 5θ | 6θ | 7θ |

FIG. 35

Arbitrary-Weight Quantization Table

| Quantization Point | Control Signal for Each Phase Selector | | | |
|---|---|---|---|---|
| $(I\_\Delta\Sigma, Q\_\Delta\Sigma)$ | C_1 (DPA) weight = 1) | C_2 (DPA) weight = 2) | C_3 (DPA) weight = 1) | C_4 (DPA) weight = 2) |
| (0, 0) | 0 | 0 | 0 | 0 |
| (1, 0) | 1 | 0 | 0 | 0 |
| (0.7, 0.7) | 2 | 0 | 0 | 0 |
| (2, 0) | 0 | 1 | 0 | 0 |
| (1.7, 0.7) | 1 | 0 | 2 | 0 |
| (1.4, 1.4) | 0 | 2 | 0 | 0 |
| (6, 0) | 1 | 1 | 1 | 1 |
| (5.4, 1.4) | 1 | 1 | 1 | 2 |
| (4.2, 4.2) | 2 | 2 | 2 | 2 |

FIG. 36

Arbitrary-Weight Quantization Table

| Quantization Point | Control Signal for Each Phase Selector | | | |
|---|---|---|---|---|
| $(I\_\Delta\Sigma, Q\_\Delta\Sigma)$ | C_1 (DPA) weight = 1) | C_2 (DPA) weight = 2) | C_3 (DPA) weight = 1) | C_4 (DPA) weight = 2) |
| (6, 0) | 1 | 1 | 1 | 1 |
| (4.2, 4.2) | 2 | 2 | 2 | 2 |
| (0, 6) | 3 | 3 | 3 | 3 |
| (-4.2, 4.2) | 4 | 4 | 4 | 4 |
| (-6, 0) | 5 | 5 | 5 | 5 |
| (-4.2, -4.2) | 6 | 6 | 6 | 6 |
| (0, -6.0) | 7 | 7 | 7 | 7 |
| (4.2, -4.2) | 8 | 8 | 8 | 8 |

*FIG. 38*

Arbitrary-Weight Quantization Table

| Quantization Point | Control Signal for Each Phase Selector | | | |
|---|---|---|---|---|
| $(I\_\Delta\Sigma, Q\_\Delta\Sigma)$ | C_1 (DPA) weight = 1) | C_2 (DPA) weight = 2) | C_3 (DPA) weight = 1) | C_4 (DPA) weight = 2) |
| (4.1, 2.1) | 0 | 1 | 2 | 2 |
| (2.1, 3.1) | 2 | 2 | 3 | 0 |
| (-2.1, 4.1) | 0 | 3 | 4 | 4 |
| (-3.7, 0.7) | 4 | 0 | 5 | 5 |
| (-3.4, -1.4) | 0 | 5 | 0 | 6 |
| (-2.1, -4.1) | 6 | 6 | 0 | 7 |
| (0.7, -3.7) | 7 | 7 | 8 | 0 |
| (2.7, -0.7) | 8 | 1 | 0 | 0 |

*FIG. 40*

Control Signal Table for Grid Mapping

| I_k | 0 | 1 | 2 |
|---|---|---|---|
| Phase | off | 0° | 180° |

FIG. 44

Grid Mapping Quantization Table

| Quantization Point $abs(I\_\Delta\Sigma) = a_n \ldots a_1$ | I_k (0, 1, 2) |
|---|---|
| $a_k = 0$ | 0 |
| $a_k = 1, I\_\Delta\Sigma > 0$ | 1 |
| $a_k = 1, I\_\Delta\Sigma < 0$ | 2 |

FIG. 45

Control Signal Table for Grid Mapping

| Q_k | 0 | 1 | 2 |
|---|---|---|---|
| Phase | off | 90° | 270° |

FIG. 46

Grid Mapping Quantization Table

| Quantization Point $abs(Q\_\Delta\Sigma) = b_n \ldots b_1$ | Q_k (0, 1, 2) |
|---|---|
| $b_k = 0$ | 0 |
| $b_k = 1, Q\_\Delta\Sigma > 0$ | 1 |
| $b_k = 1, Q\_\Delta\Sigma < 0$ | 2 |

FIG. 47

HIGH-EFFICIENCY ALL-DIGITAL TRANSMITTER

BACKGROUND

1. Field of the Invention

The present invention relates to a high-efficiency all-digital transmitter.

2. Description of Related Art

High-efficiency transmitters are preferred in wireless communications because they allow longer talk time and/or longer battery life. Conventional high-efficiency transmitter may use, for example, polar modulation schemes. However, polar domain signal processing and supply modulation in the polar modulation scheme use two separate paths to a power amplifier, an amplitude modulation ("AM") path and a phase modulation ("PM") path. The AM path and the PM path have delay mismatch problems to the power amplifier, which can make it difficult to build a supply modulator required for the AM path. Thus, it is difficult to implement a supply modulator, which has high bandwidth, low noise, and high efficiency. Therefore, production of the conventional high efficiency transmitters is costly.

Thus, there is a need for a low cost high-efficiency all-digital transmitter.

SUMMARY OF THE INVENTION

The present invention is directed to a low cost high-efficiency all-digital transmitter which uses all-digital power amplifiers. The present invention uses various mapping techniques to generate an output signal, which substantially reproduces a baseband signal at a carrier frequency. The various mapping techniques can be, for example, equal-weight mapping, binary-weight mapping, arbitrary weight mapping, and/or grid mapping. In the present invention, a baseband signal generator generates a baseband signal which is quantized by a signal processor using a quantization map specific to the selected mapping technique. The digital power amplifier ("DPA") control mapper outputs control signals to a phase selection array using the quantized signal and its corresponding entry in a quantization table. The quantization table corresponds to the quantization map and is also specific to the selected mapping technique. The phase selector array comprises multiple phase selectors, with each phase selector receiving one of the control signals. Each of the phase selectors either outputs a waveform at a carrier frequency with a phase corresponding to the control signals or outputs an inactive signal. The possible phases for the phase selectors can be increased to reduce the noise for the output signal.

A DPA array comprises a plurality of DPAs with each of the DPAs having an assigned weight according to the mapping technique. The number of phase selectors and the number of DPAs can correspond in a one to one manner. Increasing the number of phase selectors and DPAs used can reduce the noise of output signal. Each of the DPAs receives one of the waveforms from the phase selectors and outputs a power signal according to the weight of the DPA and the phase of the received waveform. The combined power signal substantially reproduces the baseband signal at the carrier frequency. Thus, the present invention can reproduce the baseband signal at the carrier frequency without using supply modulation and without mismatch problems. This can reduce the production cost of the transmitters.

In one embodiment, the present invention is a transmitter including a signal processor for receiving a baseband signal and generating a quantized signal using a quantization map, a mapper for receiving the quantized signal and generating a plurality of control signals using a quantization table, a phase selection array for receiving the plurality of control signals and generating a plurality of waveforms at a carrier frequency having a phase selected from multiple possible phases, and a digital power amplifier array for receiving the plurality of waveforms at the carrier frequency and generating an output signal.

In another embodiment, the present invention is a transmitter including a signal processor for receiving a baseband signal and generating a first quantized signal and a second quantized signal using a quantization map, a mapper for receiving the first quantized signal and the second quantized signal and generating a first plurality of control signals and a second plurality of control signals using a quantization table, a first phase selection array for receiving the first plurality of control signals and generating a first plurality of waveforms at a carrier frequency having a phase selected from multiple possible phases, a second phase selection array for receiving the second plurality of control signals and generating a second plurality of waveforms at the carrier frequency having a phase selected from multiple possible phases, and a digital power amplifier array for receiving the first plurality of waveforms at the carrier frequency and the second plurality of waveforms at the carrier frequency, and generating an output signal.

In another embodiment, the present invention is a method for generating an output signal in a transmitter including receiving a baseband signal, generating from the baseband signal, a quantized signal using a quantization map, generating from the quantized signal, a plurality of control signals using a quantization table, generating from the plurality of control signals, a plurality of waveforms at a carrier frequency having a phase selected from multiple possible phases, and generating from the plurality of waveforms at the carrier frequency, an output signal.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings.

FIG. 10 is a control signal table according to an embodiment of the present invention;

FIG. 11 is a portion of an equal-weight quantization table according to an embodiment of the present invention;

FIG. 13 is a portion of an equal-weight quantization table according to an embodiment of the present invention;

FIG. 15 is a portion of an equal-weight quantization table according to an embodiment of the present invention;

FIG. 23 is a control signal table according to an embodiment of the present invention;

FIG. 24 is a portion of a binary-weight quantization table according to an embodiment of the present invention;

FIG. 26 is a portion of a binary-weight quantization table according to an embodiment of the present invention;

FIG. 28 is a portion of a binary-weight quantization table according to an embodiment of the present invention;

FIG. 35 is a control signal table according to an embodiment of the present invention;

FIG. 36 is a portion of an arbitrary-weight quantization table according to an embodiment of the present invention;

FIG. 38 is a portion of an arbitrary-weight quantization table according to an embodiment of the present invention;

FIG. 40 is a portion of an arbitrary-weight quantization table according to an embodiment of the present invention;

FIG. 44 is a control signal table according to an embodiment of the present invention;

FIG. 45 is a portion of a grid quantization table according to an embodiment of the present invention;

FIG. 46 is a control signal table according to an embodiment of the present invention;

FIG. 47 is a portion of a grid quantization table according to an embodiment of the present invention.

DETAILED DESCRIPTION OF THE PREFERRED EMBODIMENTS

Reference will now be made in detail to the preferred embodiments of the invention which set forth the best modes contemplated to carry out the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, molding procedures have not been described in detail as not to unnecessarily obscure aspects of the present invention.

Figure 1:
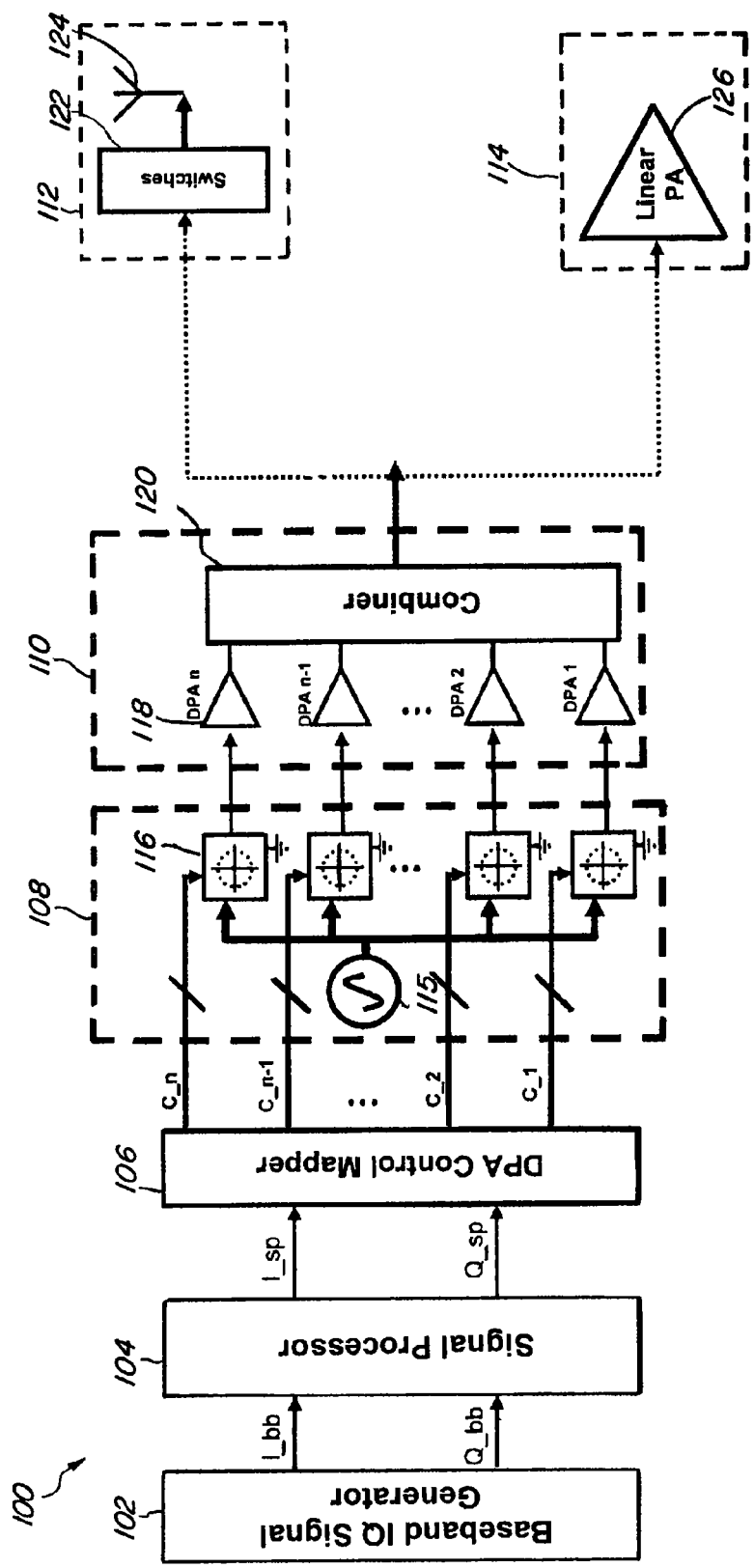
FIG. 1 is a schematic diagram of a transmitter according to an embodiment of the present invention.

As seen in FIG. 1 the present invention can include a transmitter 100, a high power output unit 112, and/or a low power output unit 114. The transmitter 100 can be, for example, a transmitter in an electronic device, such as a mobile phone. The transmitter 100 can receive, for example, an input signal and generate an output signal at a carrier frequency. The output signal can optionally be transmitted to a high power output unit 112 and/or a lower power output unit 114. The high power output unit 112 can be, for example, a front end module unit 112, and can include switches 122, and an antenna 124. The low power output unit 114 can be, for example, an external power amplifier and can include a power amplifier 126. The power amplifier 126 can be, for example, a linear power amplifier 126. The transmitter 100 includes, for example, a baseband IQ signal generator 102, a signal processor 104, a digital power amplifier ("DPA") control mapper 106, a phase selection array 108, and/or a DPA array 110.

The baseband IQ signal generator 102 receives an input signal and generates baseband signals, such as I_bb, and Q_bb. I_bb is the "I" component of the baseband signal while Q_bb is the "Q" component of the baseband signal. The signal processor 104 receives the I_bb and Q_bb signals and generates the quantized signals I_sp and Q_sp using, for example, a quantization map, which will be explained later. The DPA control mapper ("DCM") 106 receives the quantized signals I_sp and Q_sp, and generates control signals C_1 through C_n corresponding to the quantized signals using, for example, a quantization table, which will be explained later. In one embodiment, n can be any integer corresponding to a number of phase selectors in the phase selection array 108. The number of phase selectors in the phase selection array 108 can, for example, correspond to a number of DPAs in the DPA array 110.

The phase selection array 108 receives the control signals and generates a plurality of waveforms at a carrier frequency having a phase selected from multiple possible predetermined phases. The phase of each of the waveforms is determined, for example, by a corresponding control signal. For example, the phase selection array 108 can include an oscillator 115 and/or a plurality of phase selectors 116. The oscillator 115 can generate multiple phase signals which are fed to each of the phase selectors 116. The oscillator 115 can also be separate from the phase selection array 108. Each of the phase selectors 116 receives one of the control signals C_1 through C_n and the multiple phase signals. For example, one of the phase selectors 116 can receive the control signal C_1, while another one of the phase selectors 116 can receive the control signal C_n. Based on the control signal that each of the phase selectors 116 receives, the individual phase selector can output either an inactive signal or a waveform with a phase corresponding to one of the multiple phase signals, which will be explained in more detail later.

The DPA array 110 receives the plurality of waveforms at the carrier frequency and generates an output at a carrier frequency from the plurality of waveforms. The DPA array 110 can include a plurality of DPAs 118 and a combiner 120. Each of the plurality of DPAs 118 can operate in a compressed mode allowing for the DPAs 118 to operate at a high efficiency. Furthermore, each of the plurality of DPAs 118 outputs a power signal with a phase and a gain according to an assigned weight. The phase is the phase of the waveform received by the single DPA 118. Each of the plurality of DPAs 118 has a predetermined weight, which determines a magnitude of a power signal output by the single DPA 118 relative to other power signals. Thus, each of the plurality of DPA 118 receives one of the plurality of waveforms and generates a power signal with the phase of the waveform and the weight of the DPA. The combiner combines the power signals to generate the output at the carrier frequency. The output approximates the baseband signals I_bb and Q_bb at the carrier frequency.

Figure 2:
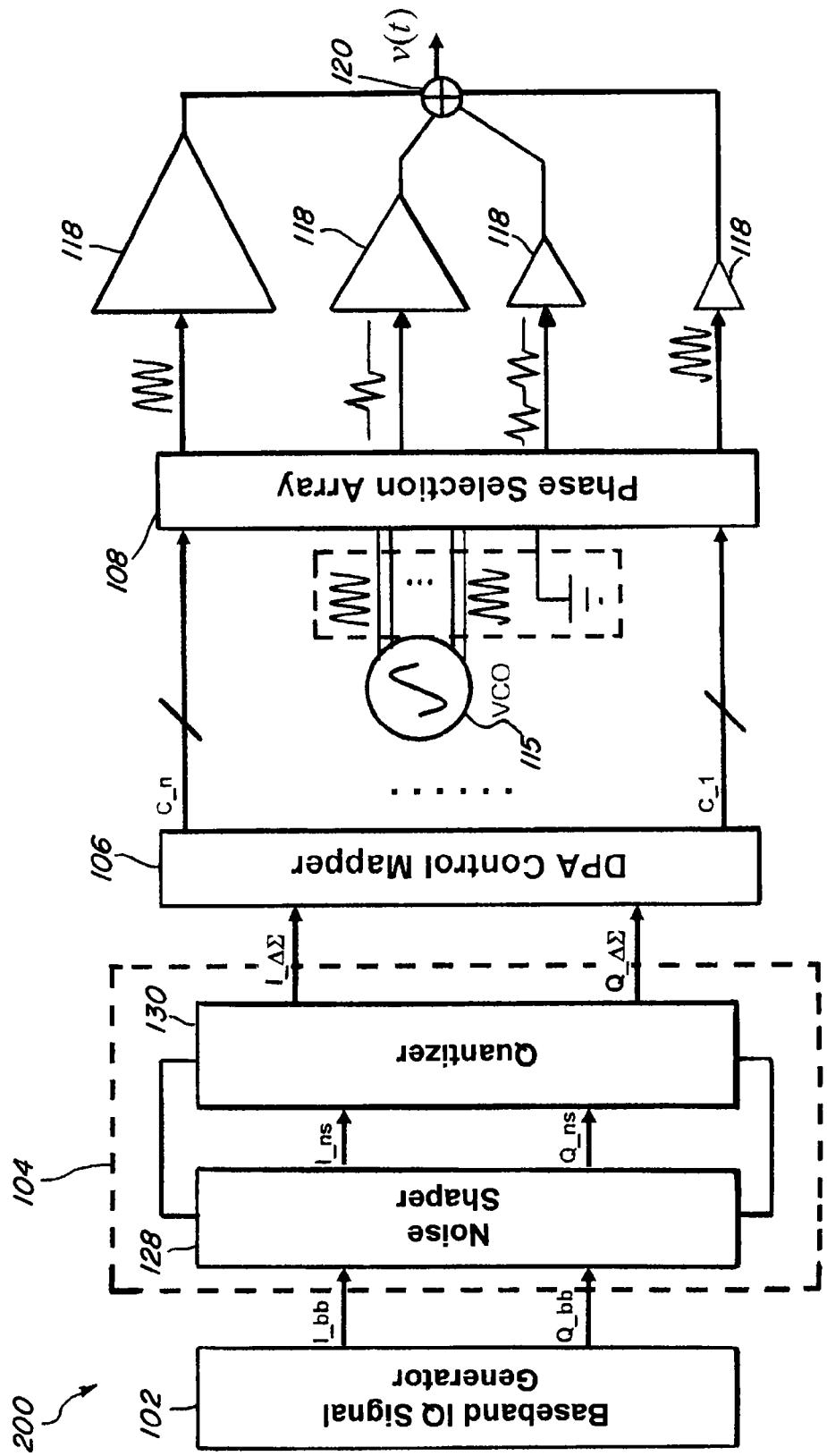
FIG. 2 is a schematic diagram of a transmitter according to an embodiment of the present invention.

FIG. 2 depicts the transmitter 200 according to an embodiment of the present invention. The transmitter 200 includes more specific components for the signal processor 104. The transmitter 200 outputs an output signal v(t) at a carrier frequency. Generally the output signal v(t) should approximate the baseband signals I_bb and Q_bb, but at the carrier frequency. In the transmitter 200, the signal processor 104 includes a noise shaper 128 and a quantizer 130. The noise shaper 128 receives the baseband signals I_bb and Q_bb and shapes their noises to generate the signals I_ns and Q_ns, which are transmitted to the quantizer 130. The quantizer 130 uses a quantization map to quantize the signals I_ns and Q_ns to generate the quantized signals $I\_\Delta\Sigma$ and $Q\_\Delta\Sigma$, which will be explained later. $I\_\Delta\Sigma$ and $Q\_\Delta\Sigma$ are signals which have been signal processed using $\Delta\Sigma$ processing and which have further been quantized to approximate the baseband signals I_bb and Q_bb. The quantizer 130 can also have a feedback loop to the noise shaper 128. In FIG. 2, the noise shaper 128 and the quantizer 130 can form, for example, a $\Delta\Sigma$ converter.

Figure 3:
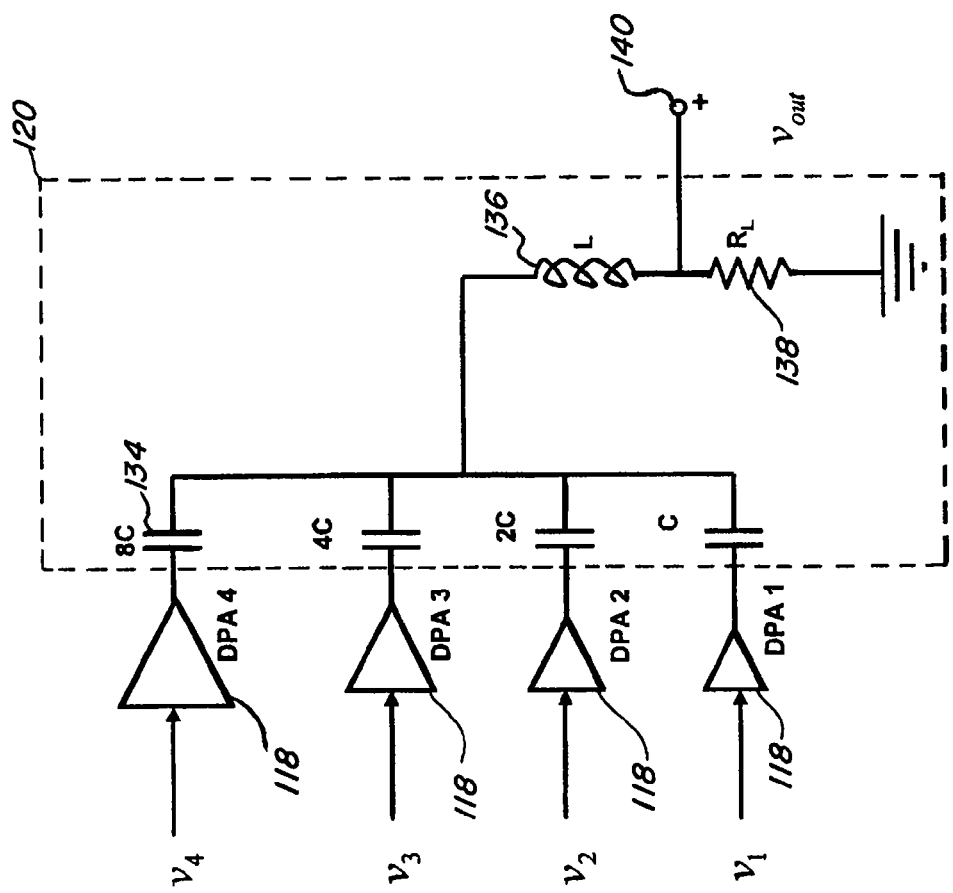
FIG. 3 is a schematic diagram of a combiner according to an embodiment of the present invention.

In FIG. 2, the oscillator 115 is separate from the phase selection array 108. Furthermore, the oscillator 115 can be, for example, a voltage controlled oscillator ("VCO") and/or a multi-phase oscillator. The oscillator 115 can produce a plurality of phases. In one embodiment, the oscillator 115 can also produce a single phase at a high frequency. In such a case, a divider can also be used in conjunction with the oscillator 115 to produce the plurality of phases. Also, the DPA array 110 is shown by its components, the plurality of DPAs 118 and the combiner 120. The combiner 120 can be seen in FIG. 3. The combiner 120 can include a plurality of capacitors 134 having varying capacitive values. The outputs of the capacitors 134 are fed into an inductor 136 connected in series with a resistor 138. The output 140 is taken between the inductor 136 and the resister 138. The output 140 is the output signal v(t) at carrier frequency such that $v(t)=I\_\Delta\Sigma(t)\cos(\omega_c t) - Q\_\Delta\Sigma(t)\sin(\omega_c t)$. $I\_\Delta\Sigma$ and $Q\_\Delta\Sigma$ are quantized approximations of I_bb and Q_bb and thus $I\_\Delta\Sigma(t)\cos(\omega_c t) - Q\_\Delta\Sigma(t)\sin(\omega_c t)$ are quantized approximations of baseband signals I_bb and Q_bb at the carrier frequency.

Referring back to FIGS. 1 and 2, the quantization map used by the signal processor 104 and/or the quantizer 130 can depend on a type of mapping technique performed. For example, the present invention can use equal-weight mapping, binary-weight mapping, arbitrary-weight mapping, grid mapping, and/or any other types of mapping which can improve a performance of a transmitter or reduce an implementation cost of a transmitter. The performance improvement can be, for example, an increase in signal-to-noise ratio and/or an efficiency of the transmitter.

Figure 4:
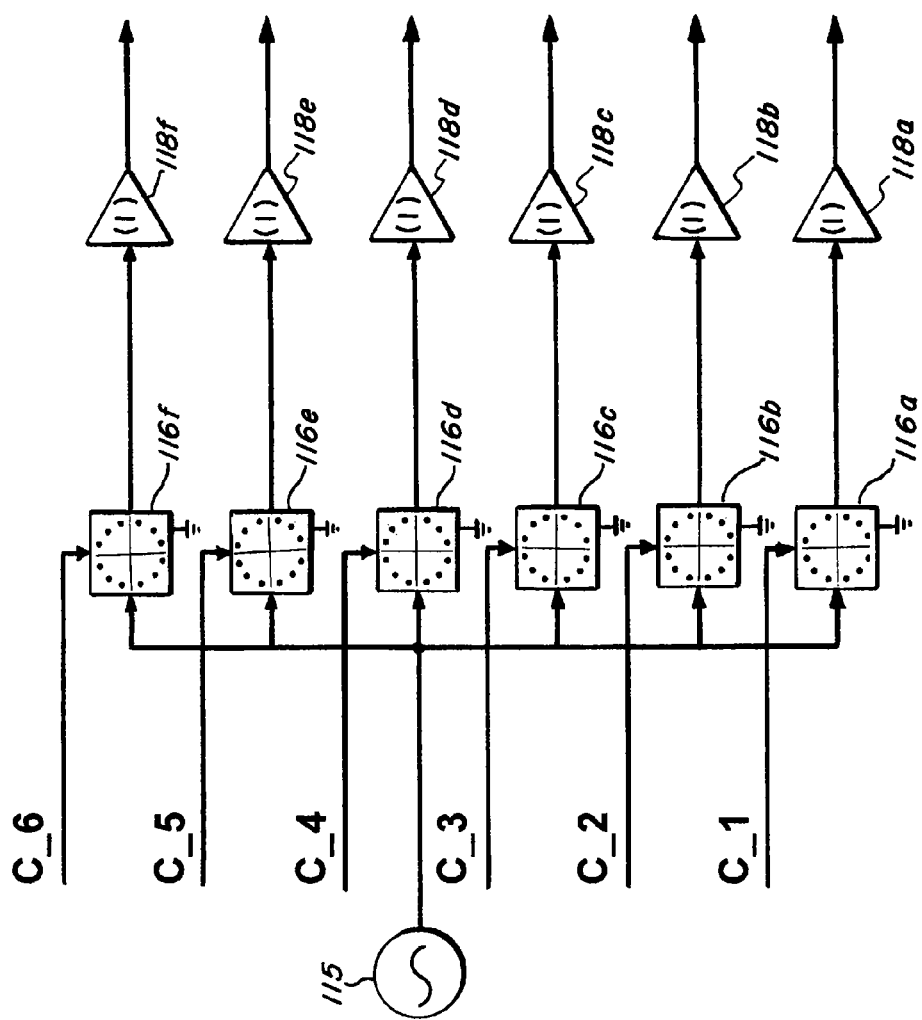
FIG. 4 is a schematic diagram of a multi-phase oscillator, phase selectors, and digital power amplifiers according to an embodiment of the present invention.

In one embodiment, as shown in FIG. 4, six phase selectors 116a-116f and six DPAs 118a-118f are used for the equal-weight mapping. Although six phase selectors 116 and six DPAs 118 are shown in FIG. 4, the number of phase selectors 116 and the number of DPAs are merely illustrative. Thus, any number of phase selectors 116 and any number of DPAs 118 may be used. Furthermore, each of the DPAs 118a-118f has its weight displayed in parenthesis. In equal-weight mapping, the weight of each DPA is equal to each other as can be seen by each of the DPAs 118a-118f in FIG. 4 having a weight of "1."

Figure 5:
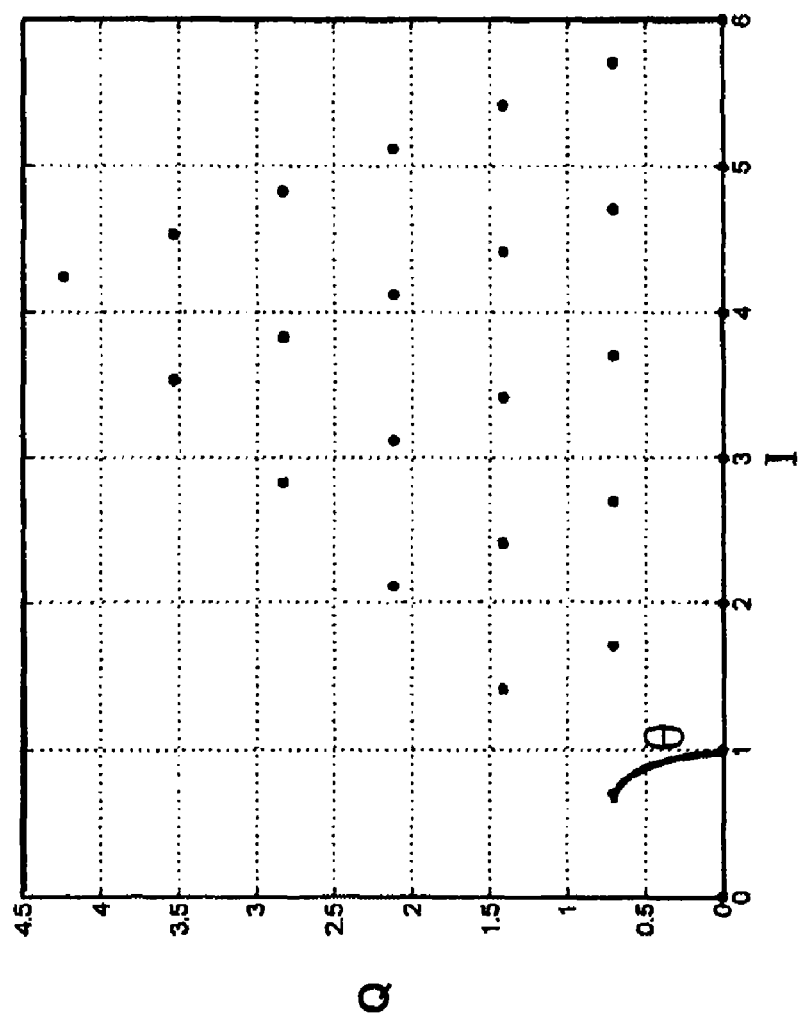
FIG. 5 is a map of a segment for an equal-weight quantization map.

When using equal-weight mapping, an equal-weight quantization map should be utilized. To generate an equal-weight quantization map, a first segment of the equal-weight quantization map is generated as shown in FIG. 5. For equal-weight mapping, each of the DPAs 118a-118f have an equal weight, such as "1." Furthermore, each of the DPAs 118a-118f can be inactive, output a power signal at carrier frequency with a 0° phase and a weight of "1", or output a power signal with a multiple of a θ phase and a weight of "1". In FIG. 5, θ is set to be 45°, however, the θ can be set at any angle. By increasing the number of DPAs 118 used or reducing the θ used, the noise in the power spectral density ("PSD") can be reduced because the number of quantization points is increased. The increase in the number of quantization points reduces noise and PSD since the Euclidian distance between the closest quantization point ($I\_\Delta\Sigma$ and $Q\_\Delta\Sigma$) and the noise shaped baseband signal (I_ns and Q_ns) is generally decreased. This can improve an approximation of the baseband signal (I_bb and Q_bb).

Figure 6:
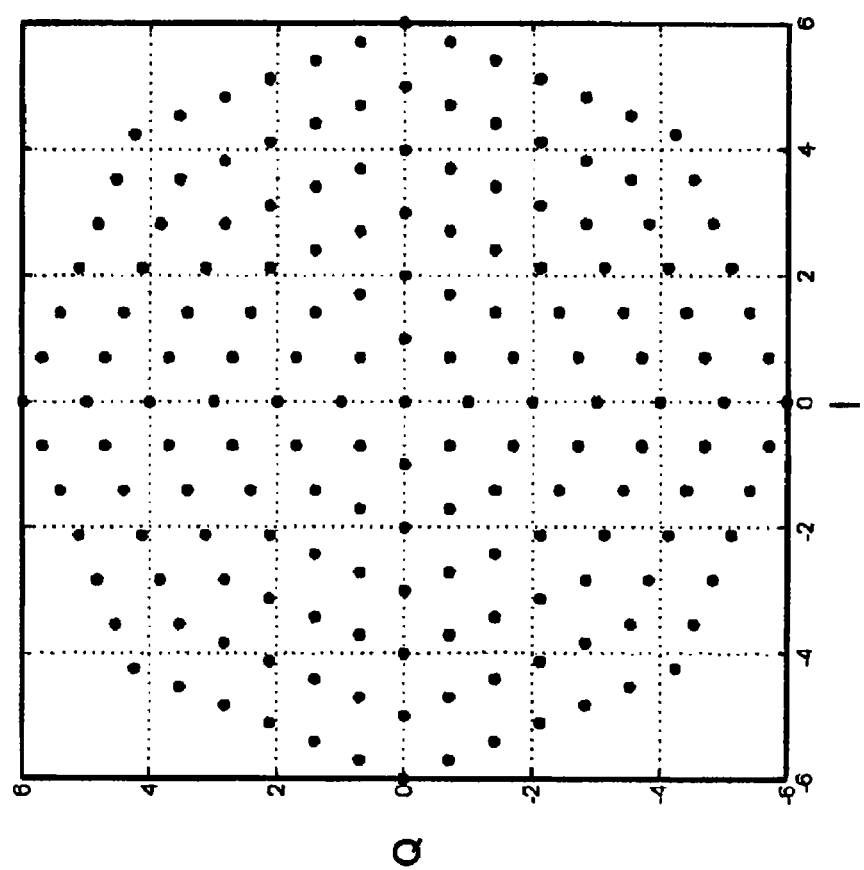
FIG. 6 is a map of an equal-weight quantization map.

As seen in FIG. 5, all combinations of the states of the DPAs 118a-118f are mapped as points on the first segment of the quantization map. For example, if all DPAs 118a-118f output power signals having 0° phase, then the total power signal output would have a weight of "6" since and each of the DPAs 118a-118f has a weight of "1". However, if all of the DPAs 118a-118f are inactive, then the output would be 0 since no DPAs would output a power signal with a weight of "1." If five DPAs 118, such as the DPAs 118a-118e are inactive and one DPA, such as DPA 118f, outputs a power signal at θ, then the total power signal output would be a quantization point "1" from the origin at an angle θ because there is only a single power signal being output with the power signal being located at an angle θ and having a weight "1." Once all of the points are mapped for the first segment, the first segment is rotated by the angle θ and copied. The process is repeated until 360° is covered to form the equal-weight quantization map as shown in FIG. 6. The equal-weight quantization map can be pre-stored in the signal processor 104 and more specifically, the quantizer 130. The equal-weight quantization map 130 can be used to map the signals I_ns and Q_ns to determine the quantized signals I_ΔΣ and Q_ΔΣ which should be output by the quantizer 130 as seen in FIG. 7 and FIG. 8.

Figure 7:
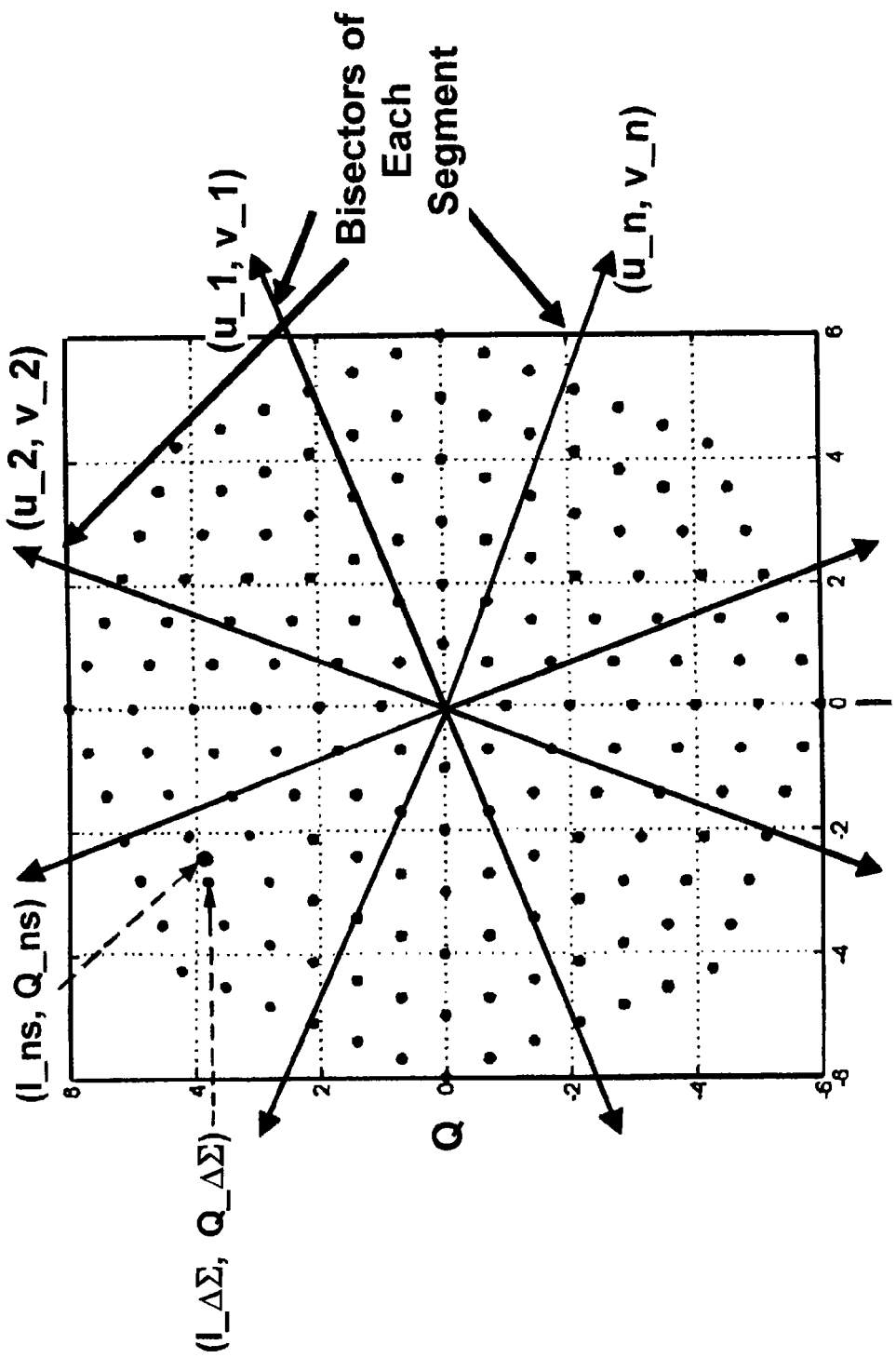
FIG. 7 is a map of an equal-weight quantization map including a quantization point according to an embodiment of the present invention.
Figure 8:
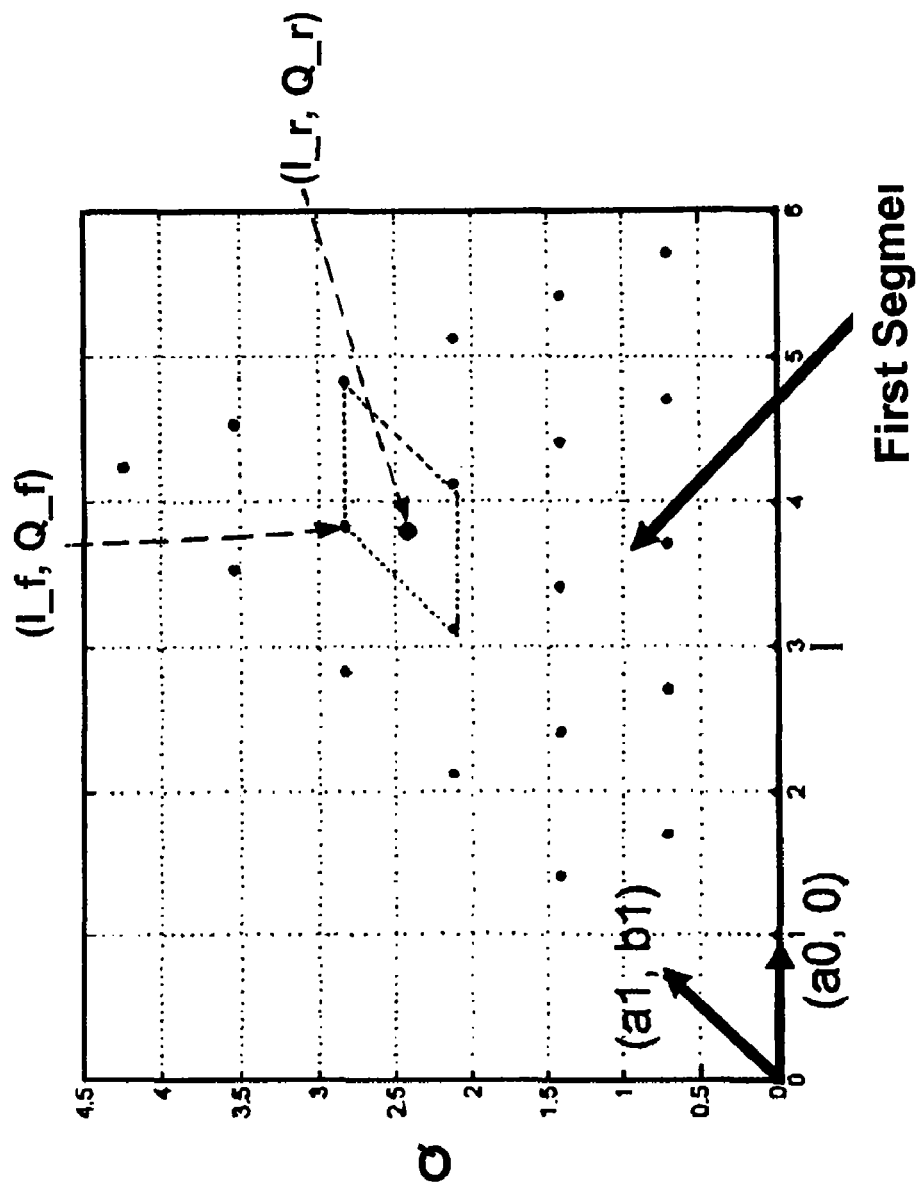
FIG. 8 is a map of a segment for an equal-weight quantization map including a quantization point according to an embodiment of the present invention.
Figure 9:
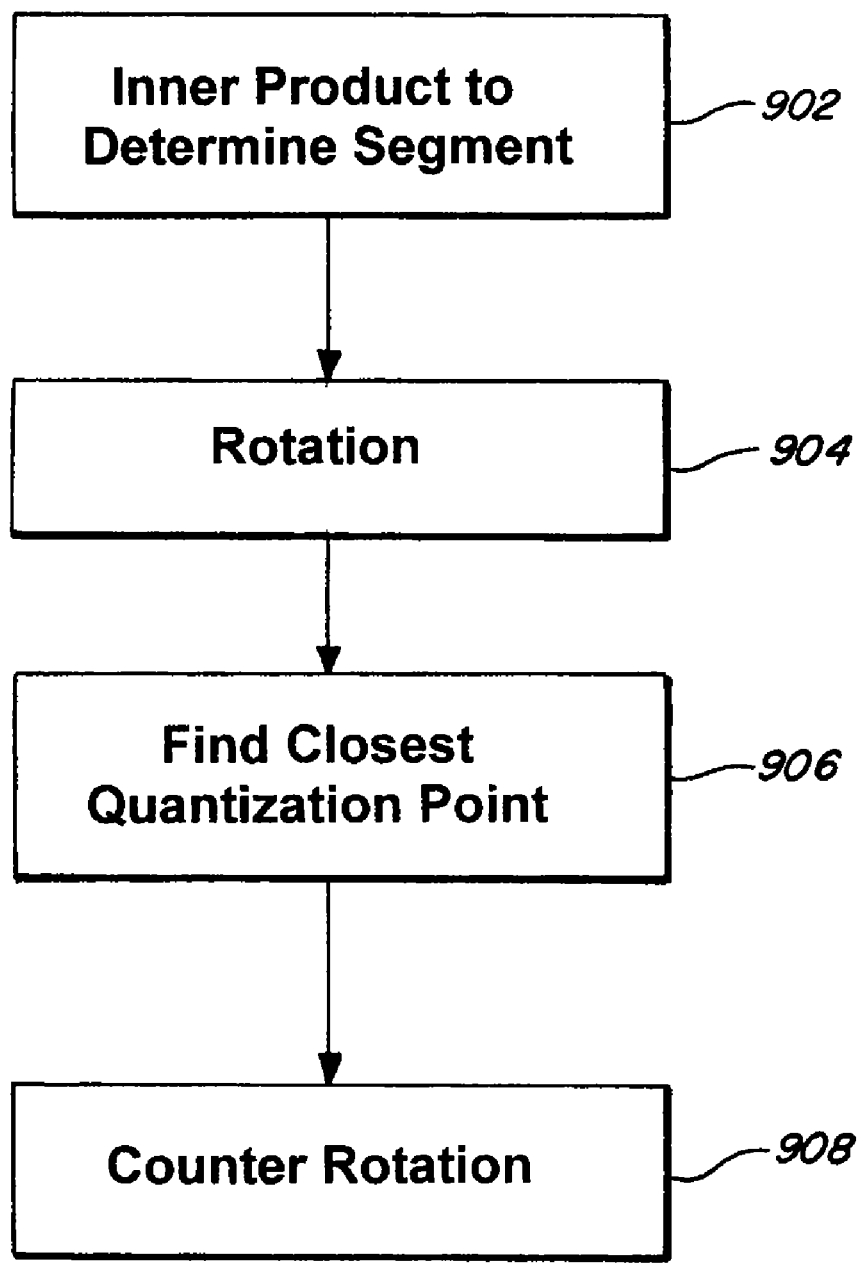
FIG. 9 is a process according to an embodiment of the present invention.

To determine the quantized signals I_ΔΣ and Q_ΔΣ which should be output, the signal processor 104 and/or the quantizer 130 can perform a process according to FIG. 9 with reference to FIG. 7 and FIG. 8. In Step S902, an inner product can be performed to determine a segment. For example, $P\_k = I\_ns * u\_k + Q\_ns * v\_k$, where $(u\_k, v\_k)$ is the k-th segment, can be computed as partially illustrated in FIG. 7. P_m can be found, which is the largest amongst all P_k. In Step S904, rotation can be performed. For example, the point (I_ns,Q_ns) can be rotated clockwise by the angle (m−1)*θ to get (I_r,Q_r), which is in the first segment. In Step S906, the closest quantization point can be found. For example, coordinates can be found. Thus, the coordinates f_1 and f_2 can be found such that $(I\_r, Q\_r) = f\_1 * (a0,0) + f\_2 * (a1,b1)$. Furthermore, a quantization point can be mapped. For example, out of the four points that enclose (I_r,Q_r):

floor(f_1)*(a0,0)+floor(f_2)*(a1,b1);

floor(f_1)*(a0,0)+ceil(f_2)*(a1,b1);

ceil(f_1)*a(0,0)+floor(f_2)*(a1,b1); and ceil(f_1)*(a0,0)+ceil(f_2)*(a1,b1)

the closest point to (I_r,Q_r) should be found. The closest point can be called, for example, (I_f,Q_f). In one embodiment, the quantization point with the closest Euclidian distance to the point indicated by the noise shaped baseband signals (I_ns, Q_ns) can be found through brute force or any other acceptable methods. In Step S908, counter-rotation can be performed. For example, the point (I_f,Q_f) can be rotated counter-clockwise by the angle (m−1)*θ to get the point (I_ΔΣ, Q_ΔΣ). The signals I_ΔΣ and Q_ΔΣ can then be output by the quantizer 130.

Using the quantization map, a quantization table can be formulated. The quantization table can be used by the DPA control mapper 106 to determine the value of the control signals sent to each of the phase selectors 116. The value of the control signals determines whether the phase selector outputs an inactive signal, or one of the waveforms at the carrier frequency. The value of the control signals also determines the phase of the waveforms at the carrier frequency.

The output of the phase selectors 116 determines the power signal output of the DPAs 118. The quantization table can include all of the points in the quantization map and the corresponding control signal to send to each phase selector. For an equal-weight quantization map, an equal-weight quantization table can be formulated. The equal-weight quantization table can be used by the DPA control mapper 106 to determine the values of the control signals C_1-C_6 to send to each of the phase selectors 116a-116f in FIG. 4. As previously noted, the value of the control signals determines whether the phase selectors 116a-116f output an inactive signal or a waveform at a carrier frequency with a phase. The value of the control signals also indicate the phase of the waveform output by each of the phase selectors 116a-116f to the corresponding DPAs 118a-118f in FIG. 4.

FIG. 10 depicts a control signal table used by the DPA control mapper 106 and/or the phase selectors 116 to code or decode the values of the control signals. For example, a control signal having a value 0 indicates that the phase selector should output an inactive signal. However, a control signal having a value 1 indicates that the phase selector should output a waveform at a carrier frequency having a phase of 0°. Furthermore the control signals having values of 2-8 indicates that the phase selector should output a waveform at a carrier frequency having a phase which is a multiple of θ.

Figure 12:
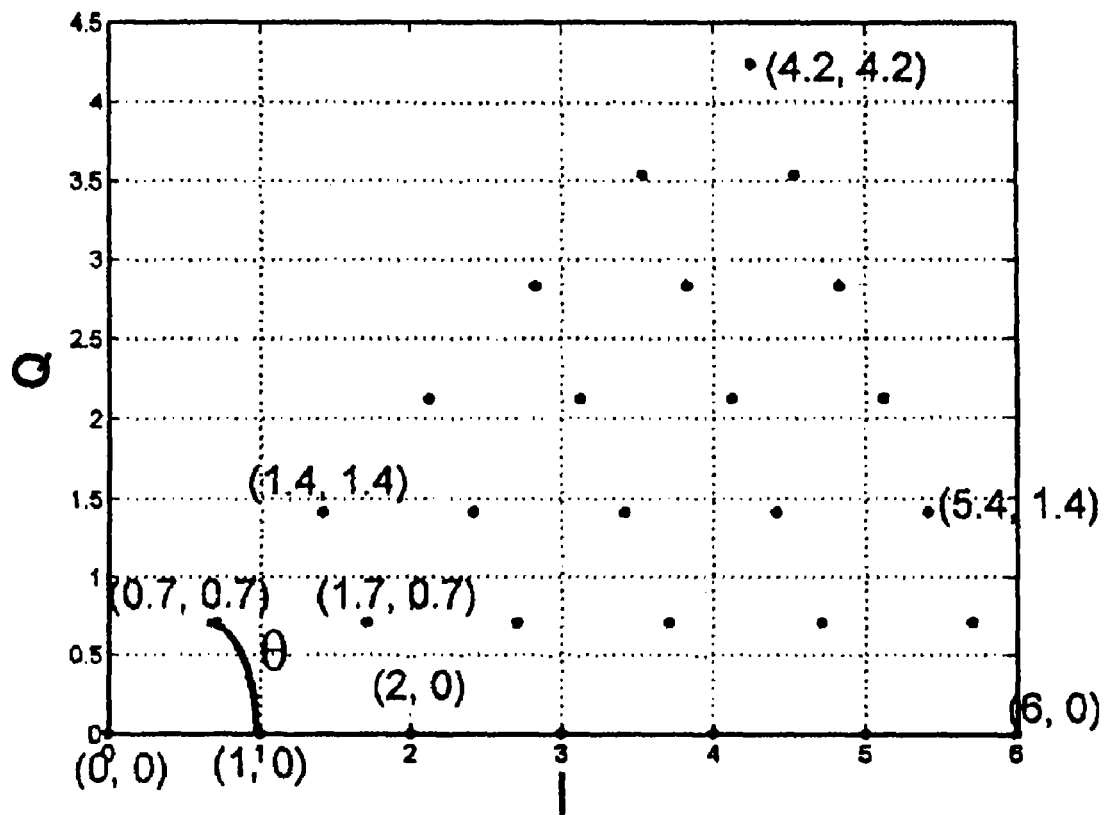
FIG. 12 is a map of a segment for an equal-weight quantization map according to an embodiment of the present invention.
Figure 14:
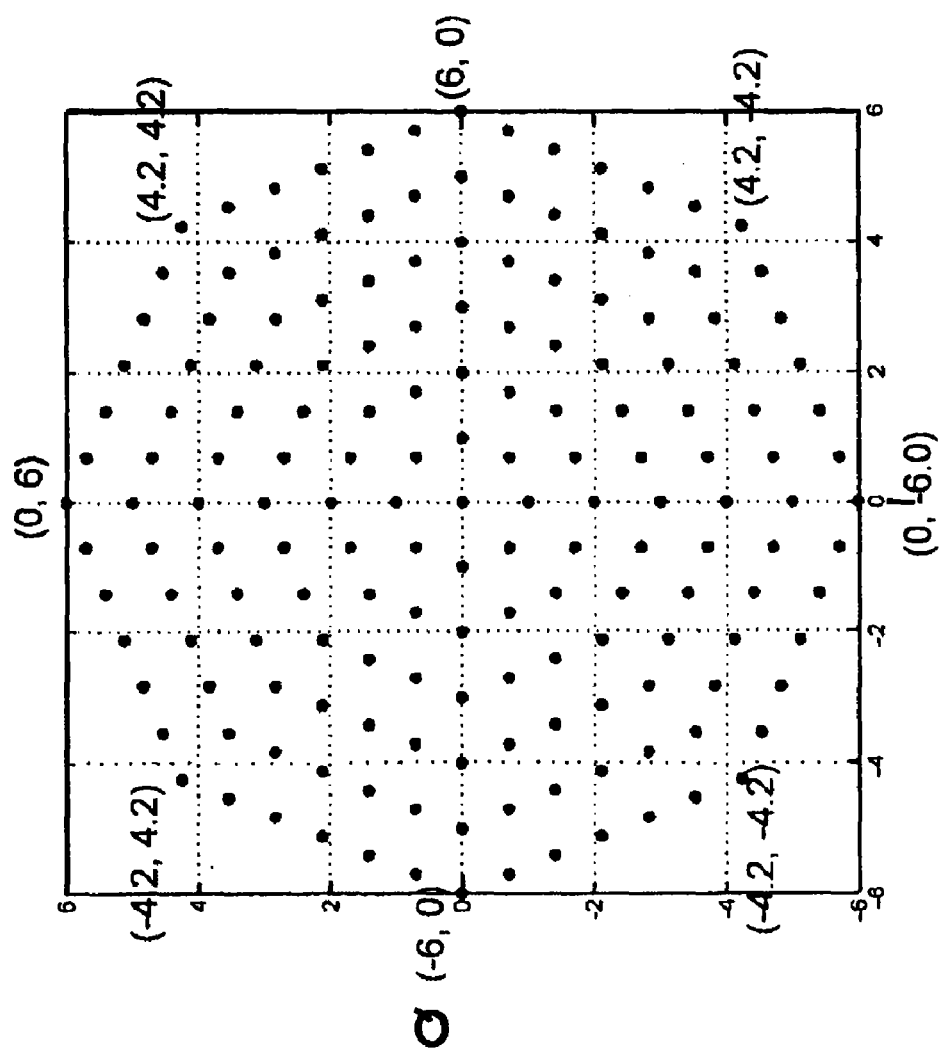
FIG. 14 is a map of an equal-weight quantization map according to an embodiment of the present invention.
Figure 16:
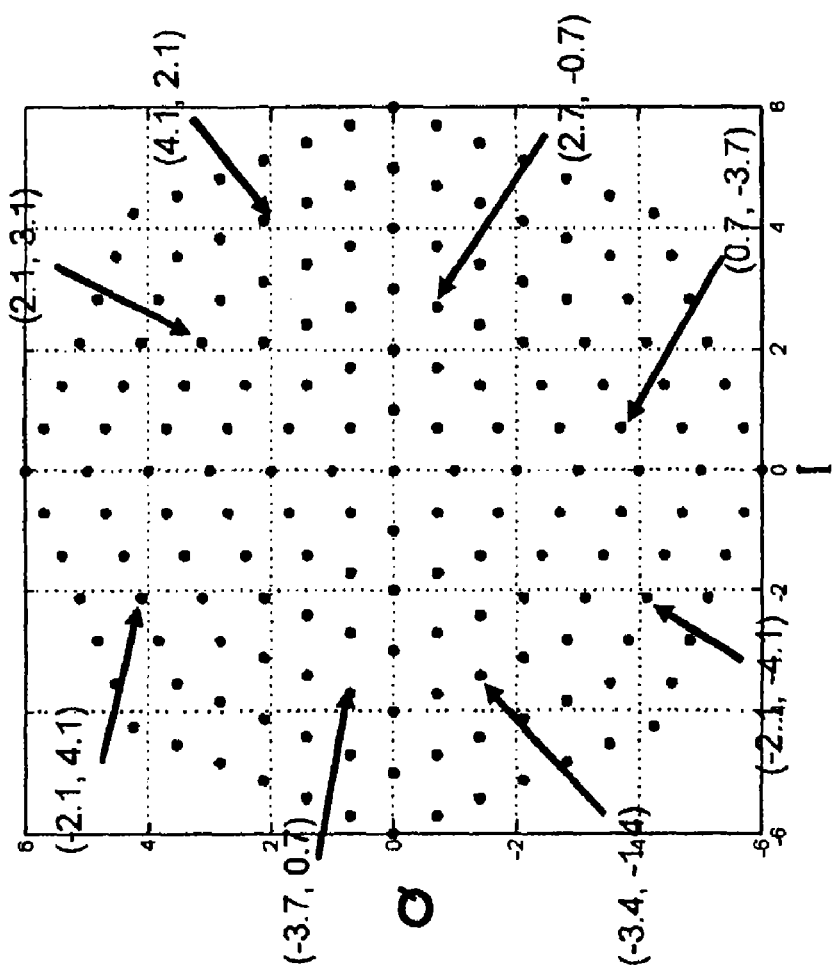
FIG. 16 is a map of an equal-weight quantization map according to an embodiment of the present invention.

FIGS. 11, 13, and 15 depict three equal-weight quantization tables which correspond to points shown in the maps of FIGS. 12, 14, and 16, respectively. Although the equal-weight quantization tables are split into three tables, they can all be combined into a single table. Furthermore, although the three equal-weight quantization tables indicate only 25 quantization points and their corresponding control signals, all of the quantization points can be indicated in one or more equal-weight quantization tables.

The equal-weight quantization tables list the quantization point and the corresponding values of the control signals. For example, for the quantization point (6,0), the corresponding value of the control signals should be C_1=1, C_2=1, C_3=1, C_4=1, C_5=1, and C_6=1 as indicated in FIG. 11. Using the control signal table shown in FIG. 10, the control signals indicate that the phase selector 116a should output a waveform with having a 0° phase, the phase selector 116b should output a waveform having a 0° phase, the phase selector 116c should output a waveform having a 0° phase, the phase selector 116d should output a waveform having a 0° phase, the phase selector 116e should output a waveform having a 0° phase, and the phase selector 116f should output a waveform having a 0° phase.

Likewise, for the quantization point (4.2, 4.2), the value of the control signals should be C_1=2, C_2=2, C_3=2, C_4=2, C_5=2, and C_6=2 as indicated in FIG. 11. Using the control signal table shown in FIG. 10, the control signals indicate that the phase selector 116a should output a waveform having a θ phase, the phase selector 116b should output a waveform having a θ phase, the phase selector 116c should output a waveform having a θ phase, the phase selector 116d should output a waveform having a θ phase, the phase selector 116e should output a waveform having a θ phase, and the phase selector 116f should output a waveform having a θ phase. The same analysis can be performed for any of the quantization points in the equal-weight quantization tables shown in FIGS. 13 and 15. The outputted waveforms having the indicated phases will cause the DPAs 118a-118f to output power signals at a carrier frequency with the corresponding phases. The combiner 120 (FIG. 2) will combine the power signals to form an output signal which is an approximation of the baseband signals I_bb and Q_bb, but at the carrier frequency. Although the above example uses a quantization table to determine the value of the control signals sent to each of the phase selectors, the methods for determining the value of the control signals are not limited to using the quantization table described above. Any other acceptable method can be used.

Figure 17:
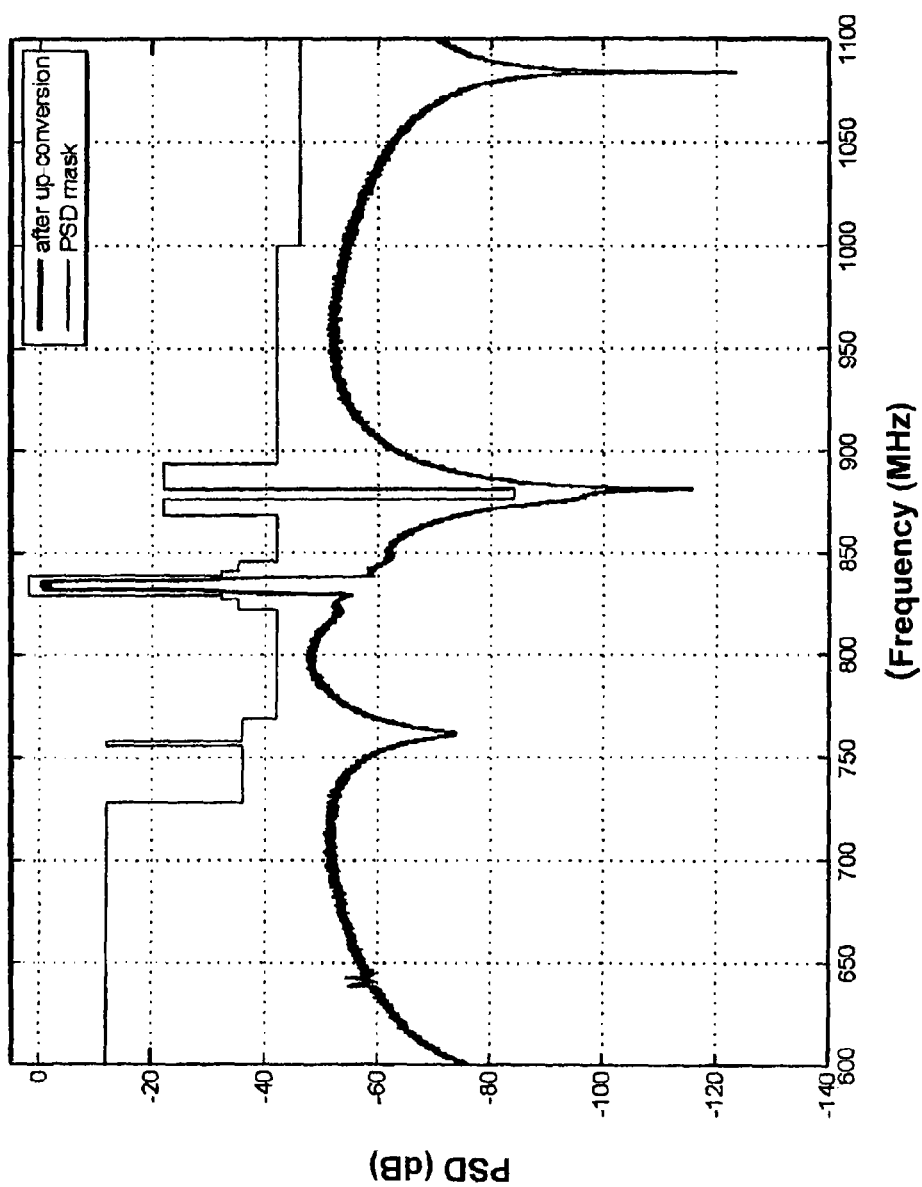
FIG. 17 is a PSD graph for an output signal of a transmitter according to an embodiment of the present invention.

FIG. 17 is a PSD graph for the output signal of the transmitter 200 according to an embodiment of the present invention. In FIG. 17, the PSD for a Band 5 LTE signal at a carrier frequency of 834 MHz with 6 DPAs is shown as the line labeled "after up-conversion." As can be seen, the PSD is below the PSD mask, which can be, for example, a PSD mask according to a guideline. The guideline can be, for example, a guideline from any organization such as the Third Generation Partnership Project ("3GPP"). Thus, the transmitter 200 can operate within the guidelines set by the 3GPP. The guideline an also be a guidelines, for example, from a governmental agency such as the Federal Communications Commission ("FCC").

Advantageously the use of equal-weight mapping uses the same DPA 118 size as linear PA solutions. Also, for every doubling in the number of DPAs 118, there is a 6 dB improvement in power spectral density, which is a 6 dB reduction in noise. Furthermore, the smaller the θ, the greater the number of quantization points, and the lower the average Euclidian Distance between the quantization points and the noise shaped baseband signal produced by the noise shaper 128. By correlation there is a more accurate representation of the baseband signal.

Figure 18:
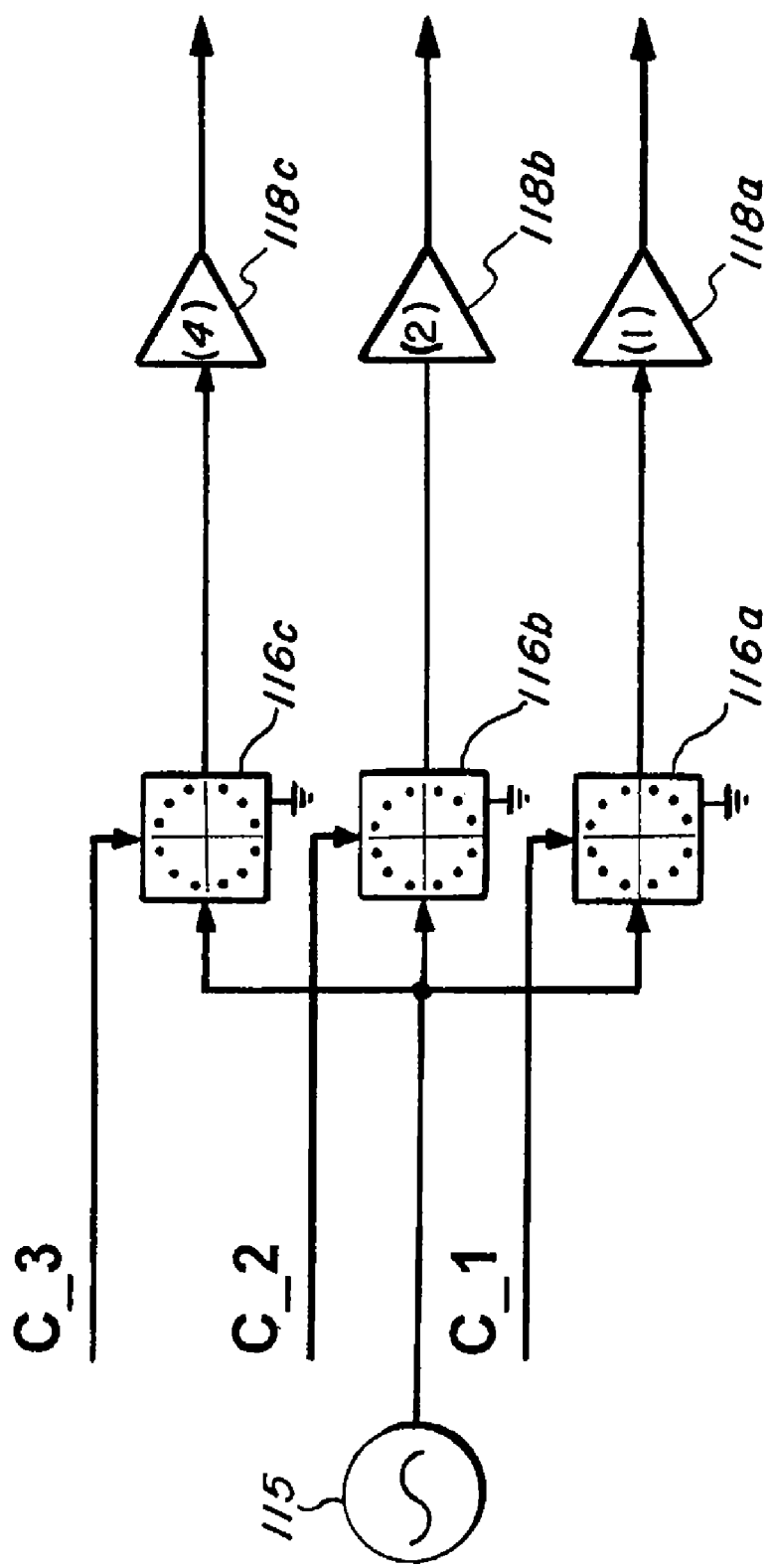
FIG. 18 is a schematic diagram of a multi-phase oscillator, phase selectors, and digital power amplifiers according to an embodiment of the present invention.

Instead of using equal-weight mapping, the present invention can also use binary-weight mapping. In one embodiment, as shown in FIG. 18, three phase selectors 116a-116c and three DPA 118a-118c are used for the binary-weight mapping. Although three phase selectors 116 and three DPAs 118 are shown in FIG. 18, the number of phase selectors 116 and the number of DPAs 118 are merely illustrative. Thus, any number of phase selectors 116 and any number of DPAs 118 may be used. Furthermore, each of the DPAs 118a-118c has its weight displayed in parenthesis. In binary-weight mapping, the weight of each DPA 118 is different and covers $2^0$ to $2^{n-1}$ where n is the number of DPAs 118. This can be seen by DPA 118a having a weight of $2^0$ or "1," DPA 118b having a weight of $2^1$ or "2," and DPA 118c having a weight of $2^2$ or "4" in FIG. 18.

Figure 19:
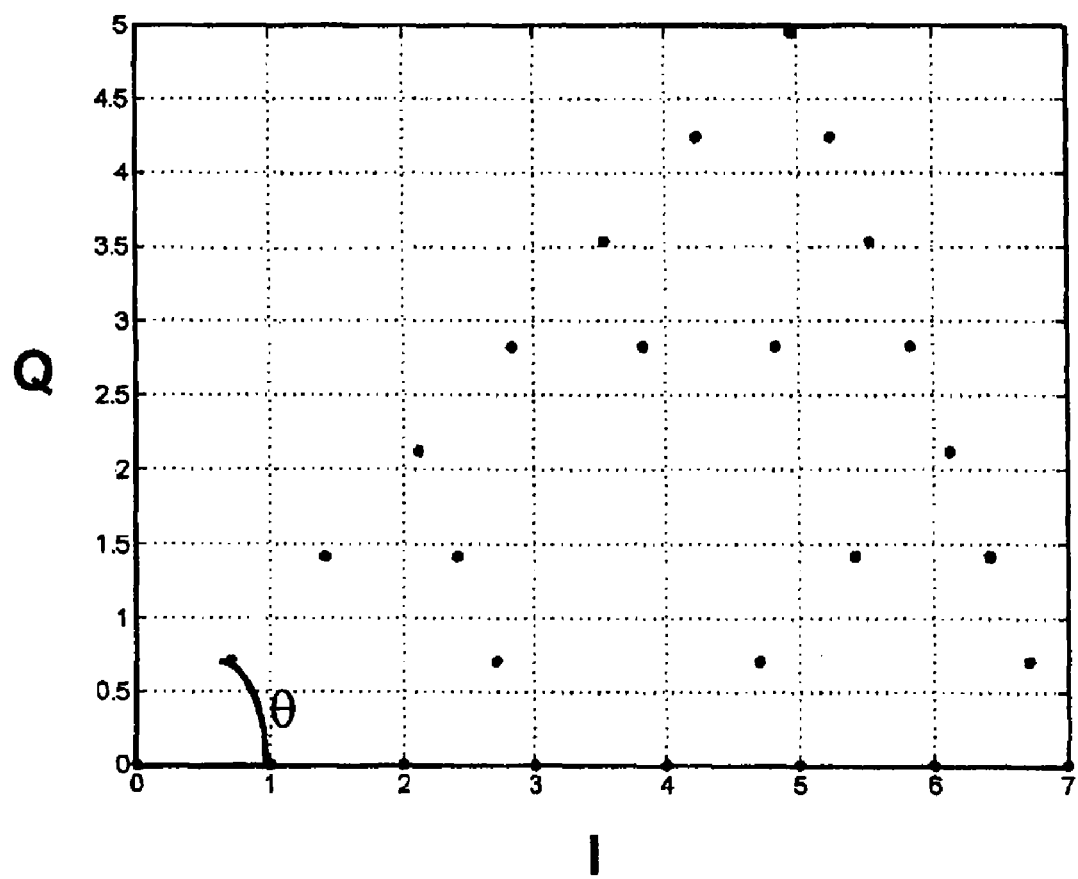
FIG. 19 is a map of a segment for a binary-weight quantization map according to an embodiment of the present invention.

When using binary-weight mapping, a binary-weight quantization map should be utilized. To generate a binary-weight quantization map, a first segment of the binary-weight quantization map is generated as shown in FIG. 19. For binary-weight mapping, each of the DPAs 118a-118c has a binary weight selected from $2^0$ to $2^{n-1}$ where n is the number of DPAs 118. Furthermore, each of the DPAs 118a-118c can be inactive, output a power signal at carrier frequency with a 0° phase and a binary weight, or output a power signal with a multiple of a θ phase and a binary weight. In FIG. 19, θ is set to be 45°, however, the θ can be set at any angle. By increasing the number of DPAs 118 used or reducing the θ used, the noise in the PSD can be reduced because the number of quantization points is increased. The increase in the number of quantization points reduces noise in the PSD since the Euclidian distance between the closest quantization point (I_ΔΣ and Q_ΔΣ) and the noise shaped baseband signal (I_ns and Q_ns) is generally decreased. This allows for a closer approximation of the baseband signal (I_bb and Q_bb).

Figure 20:
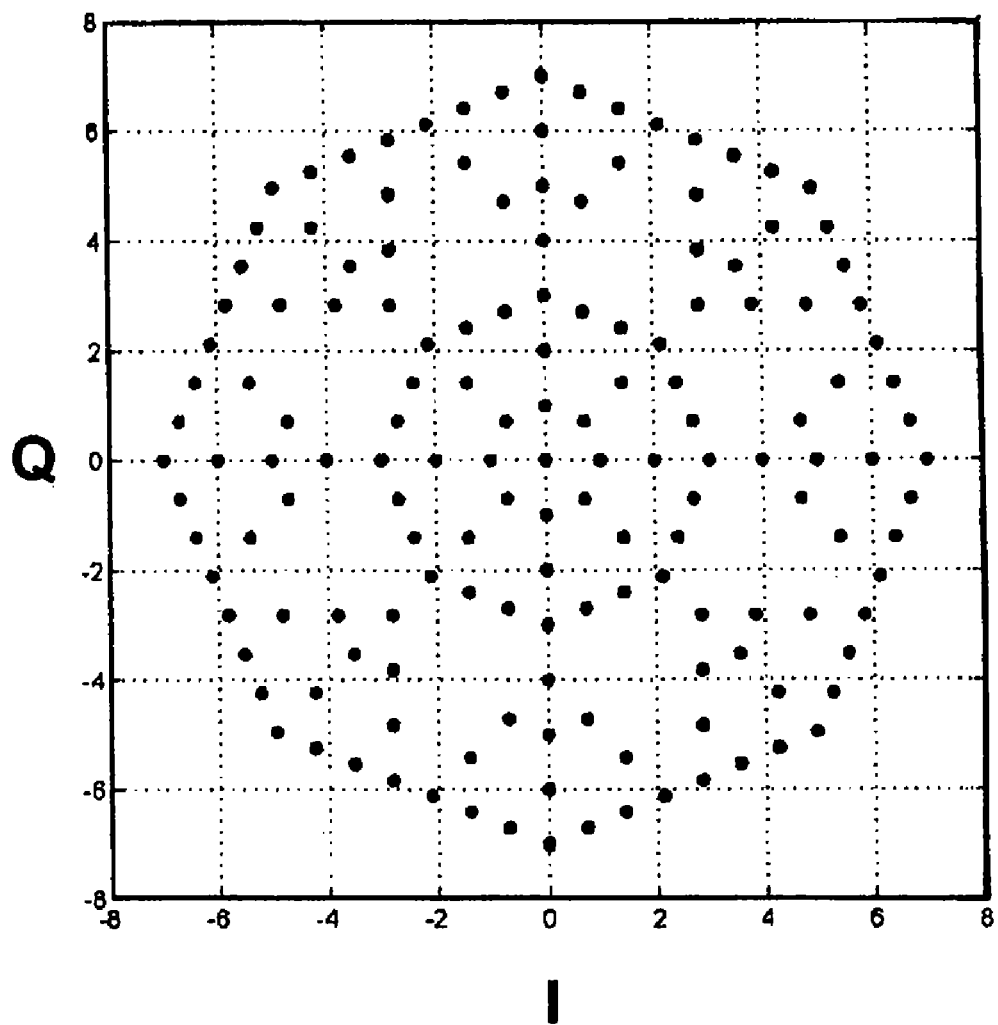
FIG. 20 is a map of a binary-weight quantization map according to an embodiment of the present invention.

As seen in FIG. 19, all combinations of the power signal outputs of the DPAs 118a-118c are mapped as quantization points on the first segment of the quantization map. For example, if all DPAs 118a-118c output power signals having 0° phase, then the total power signal output would have a weight of "7" since the DPA 118a outputs a power signal with a weight of "1," the DPA 118b outputs a power signal with a weight of "2," and the DPA 118c outputs a power signal with a weight of "4." However, if all of the DPAs 118a-118c are inactive, then the total power signal output would be 0 since no DPAs would output a power signal with a binary weight. If two DPAs 118, such as the DPAs 118a and 118b are inactive and one DPA 118 such as the DPA 118c outputs a power signal at θ, then the total power signal output would be a quantization point "4" from the origin at an angle θ because there is only a single power signal being output with the power signal being located at an angle θ and having a weight "4." Once all of the points are mapped for the first segment, the first segment is rotated by the angle θ and copied. The process is repeated until 360° is covered to form the binary-weight quantization map as shown in FIG. 20. The binary-weight quantization map can be pre-stored in the signal processor 104 and more specifically, the quantizer 130. The binary-weight quantization map 130 can be used to map the signals I_ns and Q_ns to determine the quantized signals I_ΔΣ and Q_ΔΣ which should be output by the quantizer 130 as seen in FIG. 21 and FIG. 22.

Figure 21:
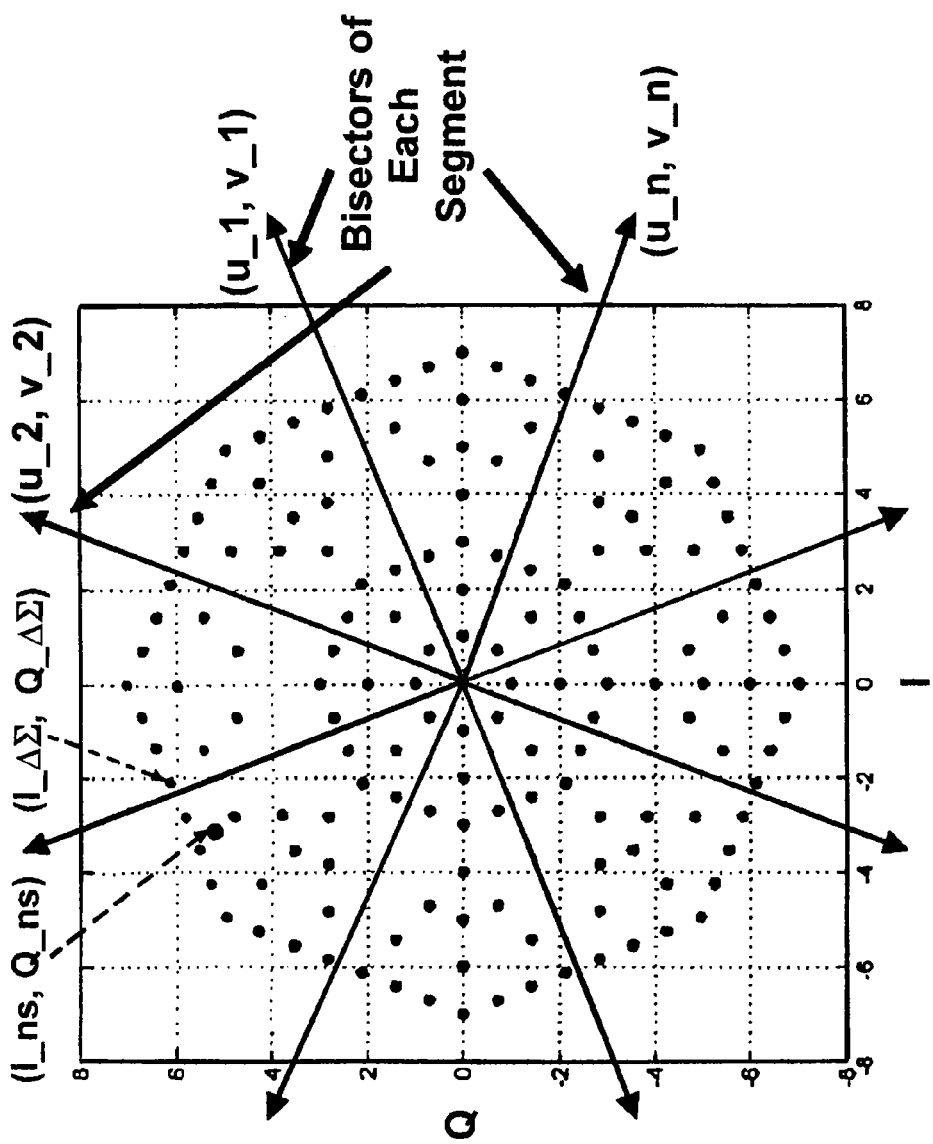
FIG. 21 is a map of a binary-weight quantization map including a quantization point according to an embodiment of the present invention.
Figure 22:
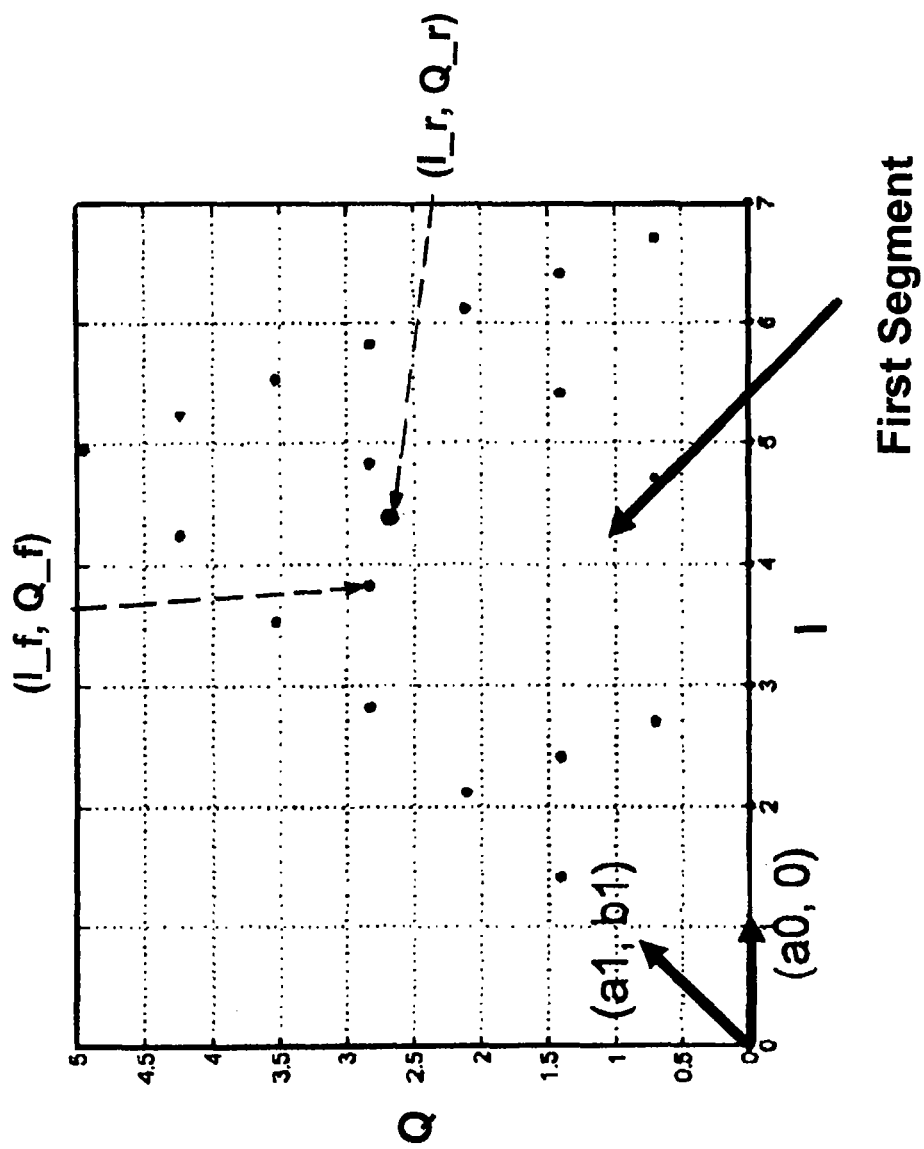
FIG. 22 is a map of a segment for a binary-weight quantization map including a quantization point according to an embodiment of the present invention.

To determine the quantized signals I_ΔΣ and Q_ΔΣ which should be output, the signal processor 104 and/or the quantizer 130 can perform a process according to FIG. 9 with reference to FIG. 21 and FIG. 22. In Step S902, an inner product can be performed to determine a segment. For example, P_k=I_ns*u_k+Q_ns*v_k, where (u_k,v_k) is the bisector of the k-th segment, can be computed as partially illustrated in FIG. 21. P_m can be found, which is the largest amongst all P_k. In Step S904, rotation can be performed. For example, the point (I_ns,Q_ns) can be rotated clockwise by the angle (m−1)*θ to get (I_r,Q_r), which is in the first segment. In Step S906, the closest quantization point can be found. For example, the point (I_f,Q_f) which is closest to the point (I_r,Q_r) is found. In one embodiment, the quantization point with the closest Euclidian distance to the point indicated by the noise shaped baseband signals (I_ns, Q_ns) can be found through brute force or any other acceptable methods. In Step S908, counter-rotation can be performed. For example, the point (I_f,Q_f) can be rotated counter-clockwise by the angle (m−1)*θ to get the point (I_ΔΣ, Q_ΔΣ). The signals I_ΔΣ and Q_ΔΣ can then be output by the quantizer 130.

For a binary-weight quantization map, a binary-weight quantization table can be formulated. The binary-weight quantization table can be used by the DPA control mapper 106 to determine the values of the control signals C_1-C_3 to send to each of the phase selectors 116a-116c in FIG. 18. As previously noted, the value of the control signals determines whether the phase selectors 116a-116c output an inactive signal or a waveform at a carrier frequency with a phase. The value of the control signals also indicate the phase of the waveform output by each of the phase selectors 116a-116c to the corresponding DPAs 118a-118c in FIG. 18.

FIG. 23 depicts a control signal table used by the DPA control mapper 106 and/or the phase selectors 116 to code or decode the values of the control signals. For example, a control signal having a value 0 indicates that the phase selector should output an inactive signal. However, a control signal having a value 1 indicates that the phase selector should output a waveform at a carrier frequency having a phase of 0°. Furthermore the control signals having values of 2-8 indicates that the phase selector should output a waveform at a carrier frequency having a phase which is a multiple of θ.

Figure 25:
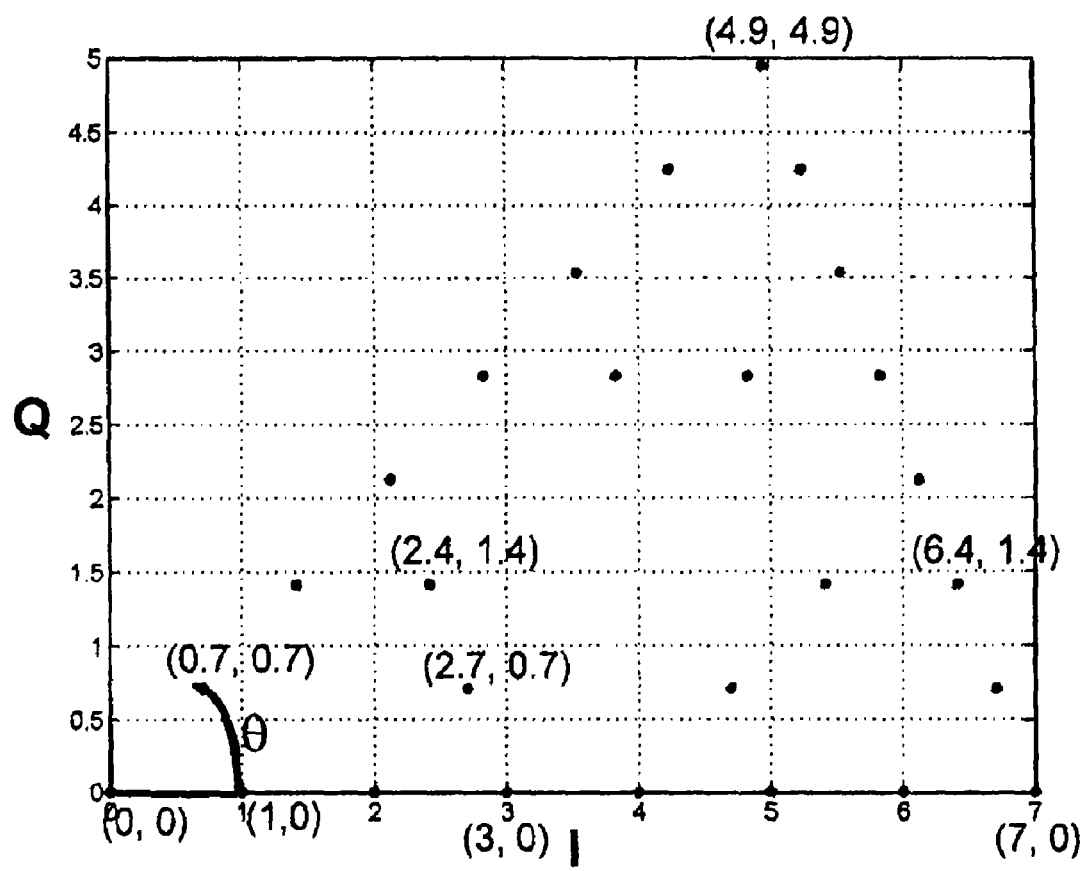
FIG. 25 is a map of a segment for a binary-weight quantization map according to an embodiment of the present invention.
Figure 27:
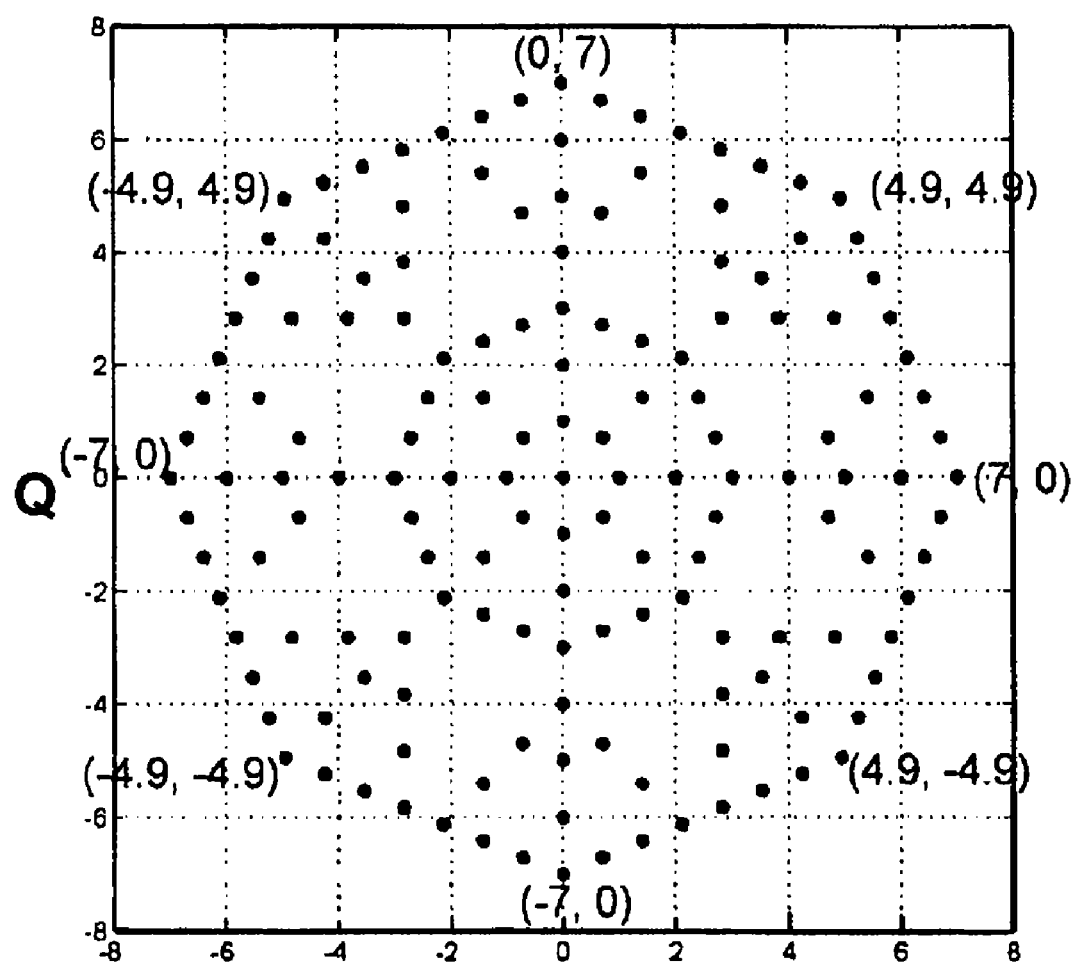
FIG. 27 is a map of a segment for a binary-weight quantization map according to an embodiment of the present invention.
Figure 29:
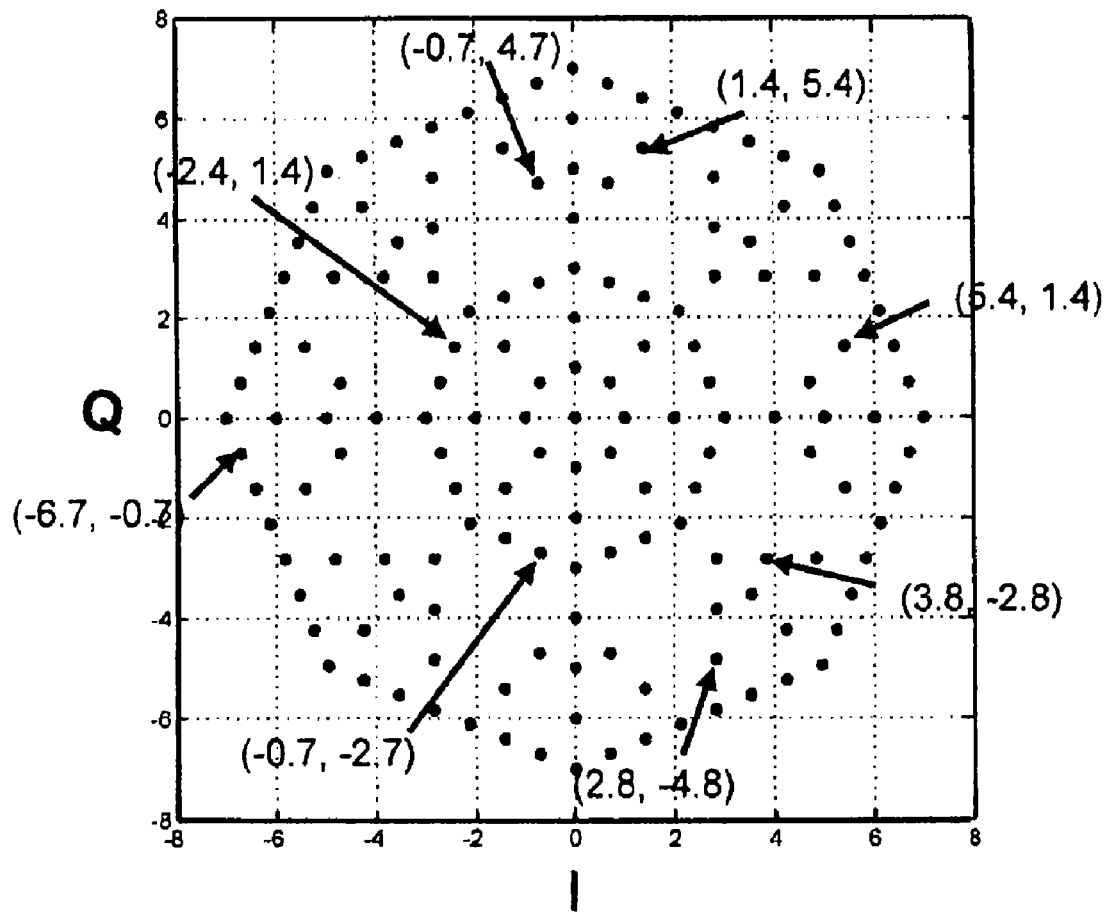
FIG. 29 is a map of a segment for a binary-weight quantization map according to an embodiment of the present invention.

FIGS. 24, 26, and 28 depict three binary-weight quantization tables which correspond to points shown in the maps of FIGS. 25, 27, and 29, respectively. Although the binary-weight quantization tables are split into three tables, they can all be combined into a single table. Furthermore, although the three binary-weight quantization tables indicate only 25 quantization points and their corresponding control signals, all of the quantization points can be indicated in one or more binary-weight quantization tables.

The binary-weight quantization tables list the quantization point and the corresponding values of the control signals. For example, for the quantization point (7,0), the corresponding value of the control signals should be C_1=1, C_2=1, and C_3=1, as indicated in FIG. 24. Using the control signal table shown in FIG. 23, the control signals indicate that the phase selector 116a should output a waveform with having a 0° phase, the phase selector 116b should output a waveform having a 0° phase, and the phase selector 116c should output a waveform having a 0° phase.

Likewise, for the quantization point (4.9, 4.9), the value of the control signals should be C_1=2, C_2=2, and C_3=2, as indicated in FIG. 24. Using the control signal table shown in FIG. 23, the control signals indicate that the phase selector 116a should output a waveform having a θ phase, the phase selector 116b should output a waveform having a θ phase, and the phase selector 116c should output a waveform having a θ phase. The same analysis can be performed for any of the quantization points in the binary-weight quantization tables shown in FIGS. 26 and 28. The outputted waveforms having the indicated phases will cause the DPAs 118a-118c to output power signals at a carrier frequency with the corresponding phases. The combiner 120 (FIG. 2) will combine the power signals to form an output signal which is an approximation of the baseband signals I_bb and Q_bb, but at the carrier frequency. Although the above example uses a quantization table to determine the value of the control signals sent to each of the phase selectors, the methods for determining the value of the control signals are not limited to using the quantization table described above. Any other acceptable method can be used.

Advantageously the use of binary-weight mapping uses the same DPA 118 size as linear PA solutions. In addition, binary-weight mapping generally uses fewer DPAs 118 when compared with equal-weight mapping. Furthermore, the smaller the θ, the greater the number of quantization points, and the lower the average Euclidian Distance between the quantization points and the noise shaped baseband signal produced by the noise shaper 128. By correlation there is a more accurate representation of the baseband signal.

Figure 30:
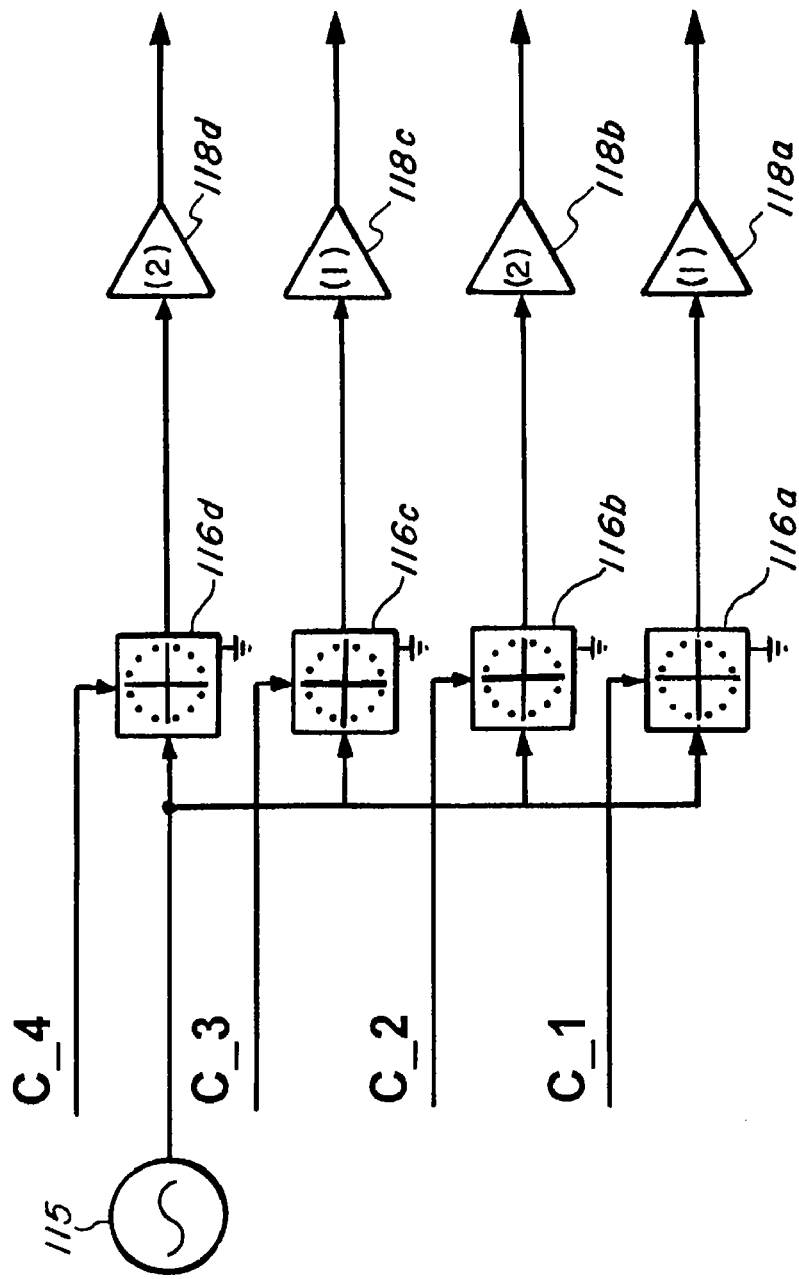
FIG. 30 is a schematic diagram of an oscillator, phase selectors, and digital power amplifiers according to an embodiment of the present invention.

In one embodiment, as shown in FIG. 30, four phase selectors 116a-116d and four DPAs 118a-118d are used for the arbitrary-weight mapping. Although four phase selectors 116 and four DPAs 118 are shown in FIG. 30, the number of phase selectors 116 and the number of DPAs are merely illustrative. Thus, any number of phase selectors 116 and any number of DPAs 118 may be used. Furthermore, each of the DPAs 118a-118d has its weight displayed in parenthesis. In arbitrary-weight mapping, the weight of each DPA can be random, as seen by the DPA 118a having a weight of "1," the DPA 118b having a weight "2," the DPA 118c having a weight of "1" and the DPA 118d having a weight of "2."

Figure 31:
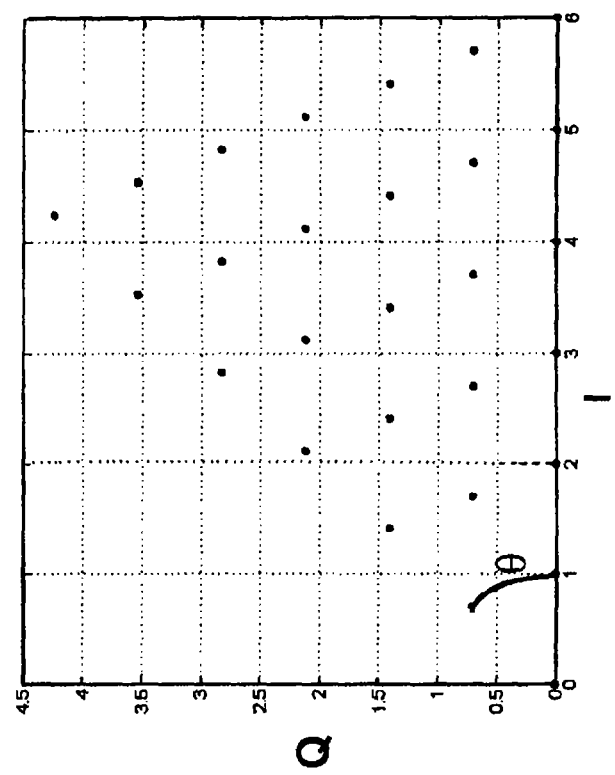
FIG. 31 is a map of a segment for an arbitrary-weight quantization map according to an embodiment of the present invention.

When using arbitrary-weight mapping, an arbitrary-weight quantization map should be utilized. To generate an arbitrary-weight quantization map, a first segment of the arbitrary-weight quantization map is generated as shown in FIG. 31. For arbitrary-weight mapping, each of the DPAs 118a-118d have an arbitrary weight, which in this example is "1" or "2." Furthermore, each of the DPAs 118a-118d can be inactive, output a power signal at carrier frequency with a 0° phase and the arbitrary weight, or output a power signal with a multiple of a θ phase and the arbitrary weight. In FIG. 31, θ is set to be 45°, however, the θ can be set at any angle. By increasing the number of DPAs 118 used or reducing the θ used, the noise in the PSD can be reduced because the number of quantization points is increased. The increase in the number of quantization points reduces noise in the PSD since the Euclidian distance between the closest quantization point (I_ΔΣ and Q_ΔΣ) and the noise shaped baseband signal (I_ns and Q_ns) is generally decreased. This allows for a closer approximation of the baseband signal (I_bb and Q_bb).

Figure 32:
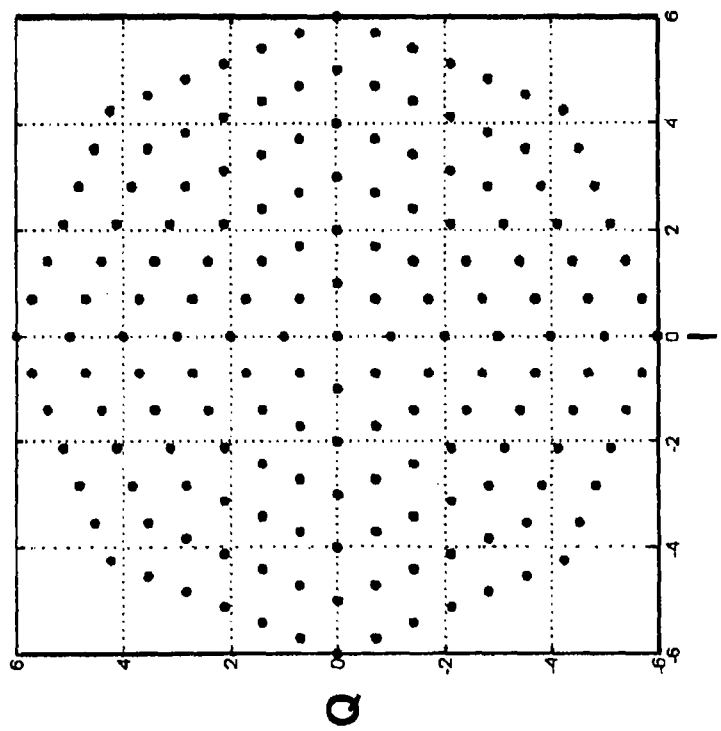
FIG. 32 is a map of an arbitrary-weight quantization map according to an embodiment of the present invention.

As seen in FIG. 31, all combinations of the states of the DPAs 118a-118d are mapped as points on the first segment of the quantization map. For example, if all DPAs 118a-118d output power signals having 0° phase, then the total power signal output would have a weight of "6" since the DPA 118a would output a power signal with a weight of "1," the DPA 118b would output a power signal with a weight of "2," the DPA 118c would output a power signal with a weight of "1," and the DPA 118d would output a power signal with a weight of "2." However, if all of the DPAs 118a-118d are inactive, then the output would be 0 since no DPAs would output a power signal with any weight. If three DPAs 118, such as the DPAs 118a-118c are inactive and one DPA, such as DPA 118d, outputs a power signal at θ, then the total power signal output would be a quantization point "2" from the origin at an angle θ because there is only a single power signal being output with the power signal being located at an angle θ and having a weight "2." Once all of the points are mapped for the first segment, the first segment is rotated by the angle θ and copied. The process is repeated until 360° is covered to form the arbitrary-weight quantization map as shown in FIG. 32. The arbitrary-weight quantization map can be pre-stored in the signal processor 104 and more specifically, the quantizer 130. The arbitrary-weight quantization map 130 can be used to map the signals I_ns and Q_ns to determine the quantized signals I_ΔΣ and Q_ΔΣ which should be output by the quantizer 130 as seen in FIG. 33 and FIG. 34.

Figure 33:
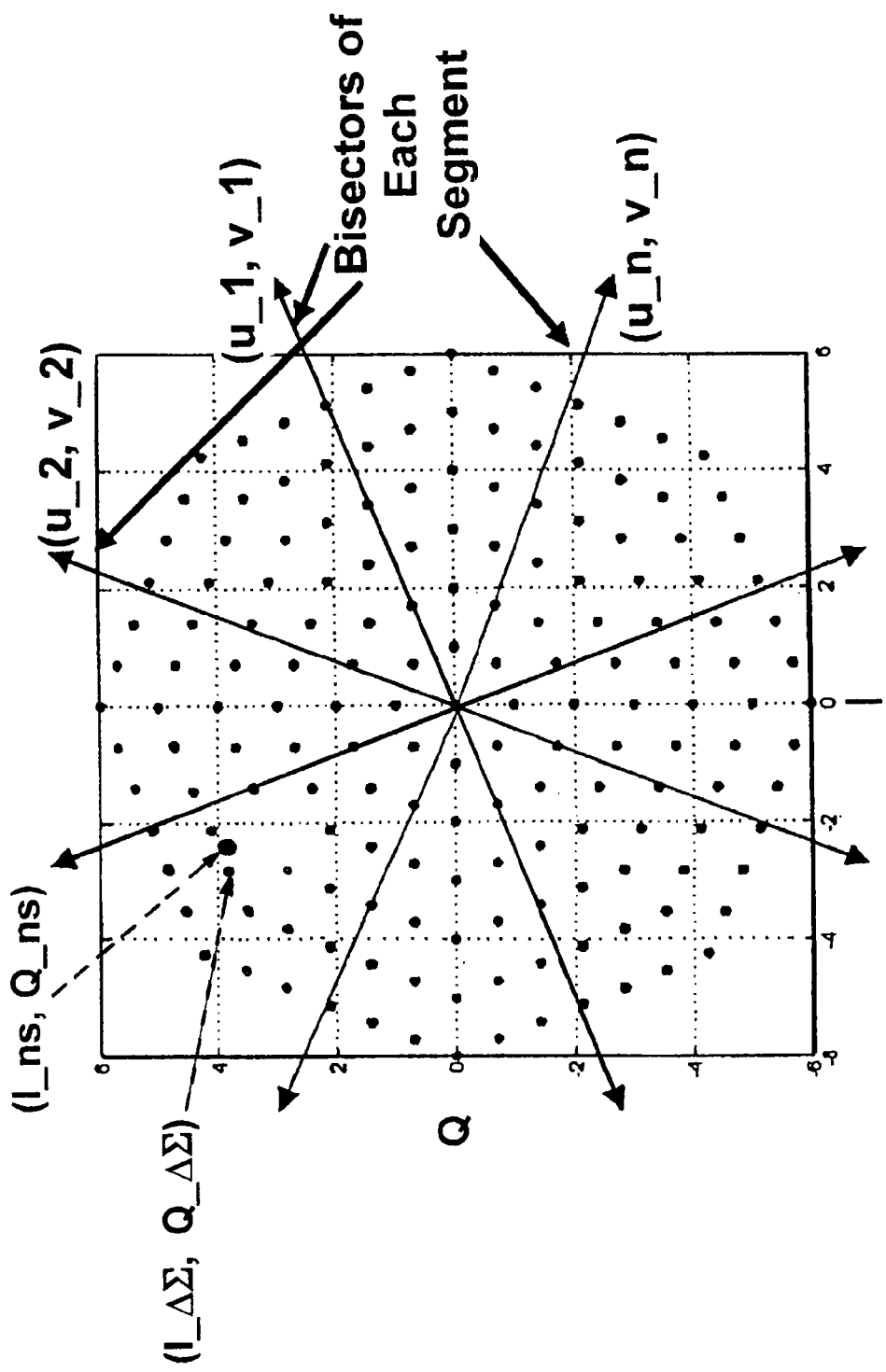
FIG. 33 is a map of an arbitrary-weight quantization map including a quantization point according to an embodiment of the present invention.
Figure 34:
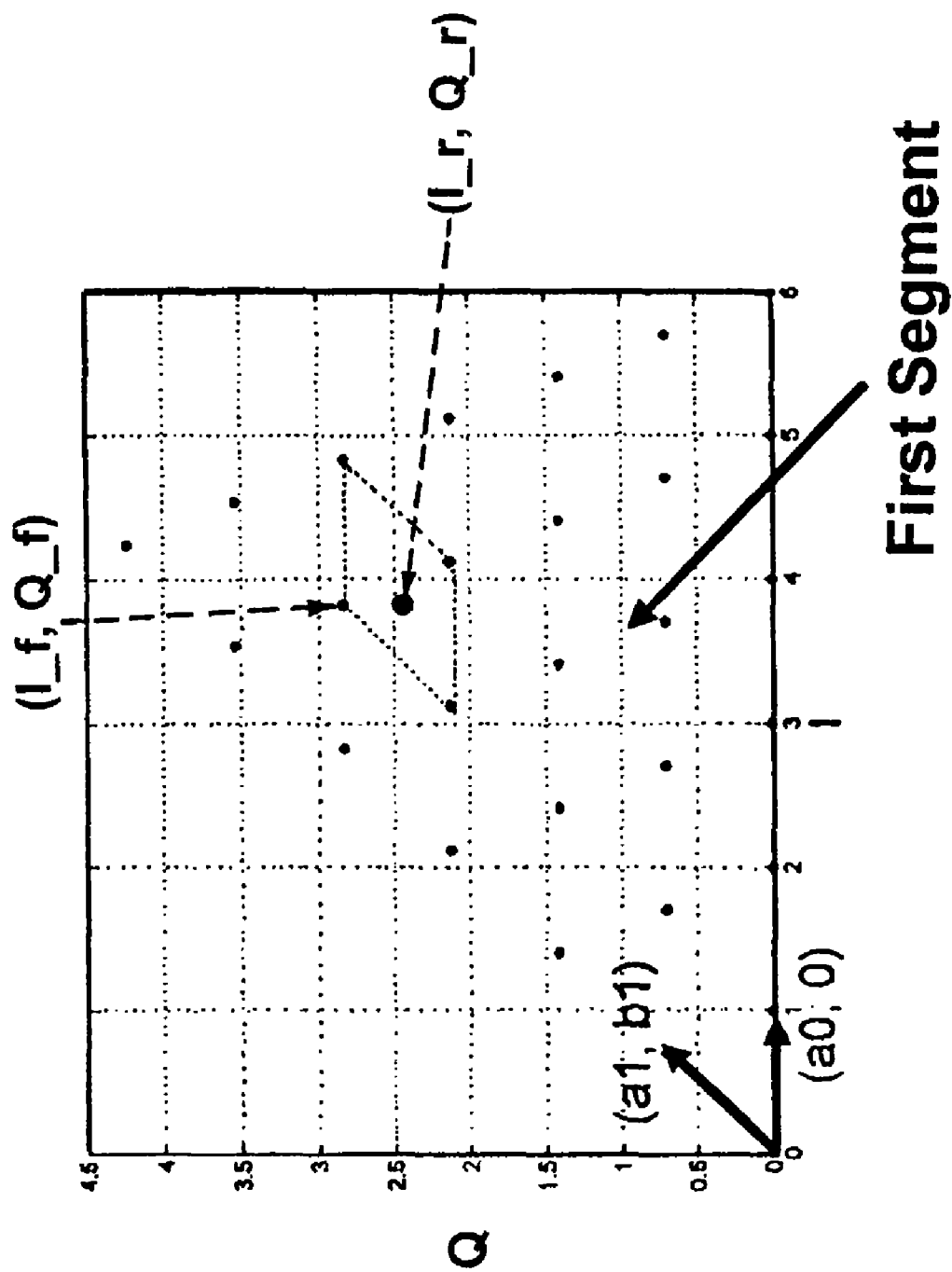
FIG. 34 is a map of a segment for an arbitrary-weight quantization map including a quantization point according to an embodiment of the present invention.

To determine the quantized signals I_ΔΣ and Q_ΔΣ which should be output, the signal processor 104 and/or the quantizer 130 can perform a process according to FIG. 9 with reference to FIG. 33 and FIG. 34. In Step S902, an inner product can be performed to determine a segment. For example, $P\_k = I\_ns * u\_k + Q\_ns * v\_k$, where $(u\_k, v\_k)$ is the bisector of the k-th segment, can be computed as partially illustrated in FIG. 33. P_m can be found, which is the largest amongst all P_k. In Step S904, rotation can be performed. For example, the point (I_ns,Q_ns) can be rotated clockwise by the angle $(m-1)*\theta$ to get (I_r,Q_r), which is in the first segment. In Step S906, the closest quantization point can be found. For example, coordinates can be found. Thus, the coordinates f_1 and f_2 can be found such that $(I\_r, Q\_r) = f\_1 * (a0,0) + f\_2 * (a1,b1)$. Furthermore, a quantization point can be mapped. For example, out of the four points that enclose (I_r,Q_r):

floor(f_1)*(a0,0)+floor(f_2)*(a1,b1);

floor(f_1)*(a0,0)+ceil(f_2)*(a1,b1);

ceil(f_1)*a(0,0)+floor(f_2)*(a1,b1); and ceil(f_1)*(a0,0)+ceil(f_2)*(a1,b1)

the closest point to (I_r,Q_r) should be found. The closest point can be called, for example, (I_f,Q_f). In one embodiment, the quantization point with the closest Euclidian distance to the point indicated by the noise shaped baseband signals (I_ns, Q_ns) can be found through brute force or any other acceptable methods. In Step S908, counter-rotation can be performed. For example, the point (I_f,Q_f) can be rotated counter-clockwise by the angle (m−1)*θ to get the point (I_ΔΣ, Q_ΔΣ). The signals I_ΔΣ and Q_ΔΣ can then be output by the quantizer 130.

For an arbitrary-weight quantization map, an arbitrary-weight quantization table can be formulated. The arbitrary-weight quantization table can be used by the DPA control mapper 106 to determine the values of the control signals C_1-C_4 to send to each of the phase selectors 116a-116d in FIG. 30. As previously noted, the value of the control signals determines whether the phase selectors 116a-116d output an inactive signal or a waveform at a carrier frequency with a phase. The value of the control signals also indicate the phase of the waveform output by each of the phase selectors 116a-116d to the corresponding DPAs 118a-118d in FIG. 30.

FIG. 35 depicts a control signal table used by the DPA control mapper 106 and/or the phase selectors 116 to code or decode the values of the control signals. For example, a control signal having a value 0 indicates that the phase selector should output an inactive signal. However, a control signal having a value 1 indicates that the phase selector should output a waveform at a carrier frequency having a phase of 0°. Furthermore the control signals having values of 2-8 indicates that the phase selector should output a waveform at a carrier frequency having a phase which is a multiple of θ.

Figure 37:
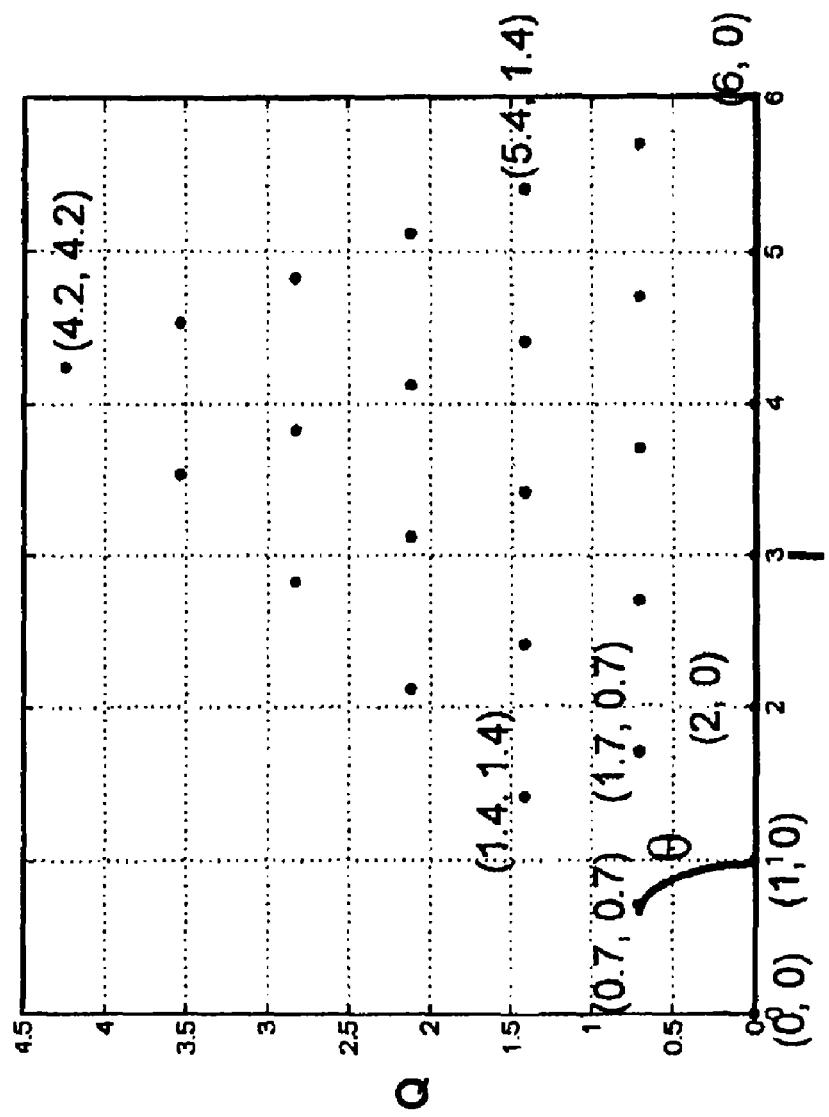
FIG. 37 is a map of a segment for an arbitrary-weight quantization map according to an embodiment of the present invention.
Figure 39:
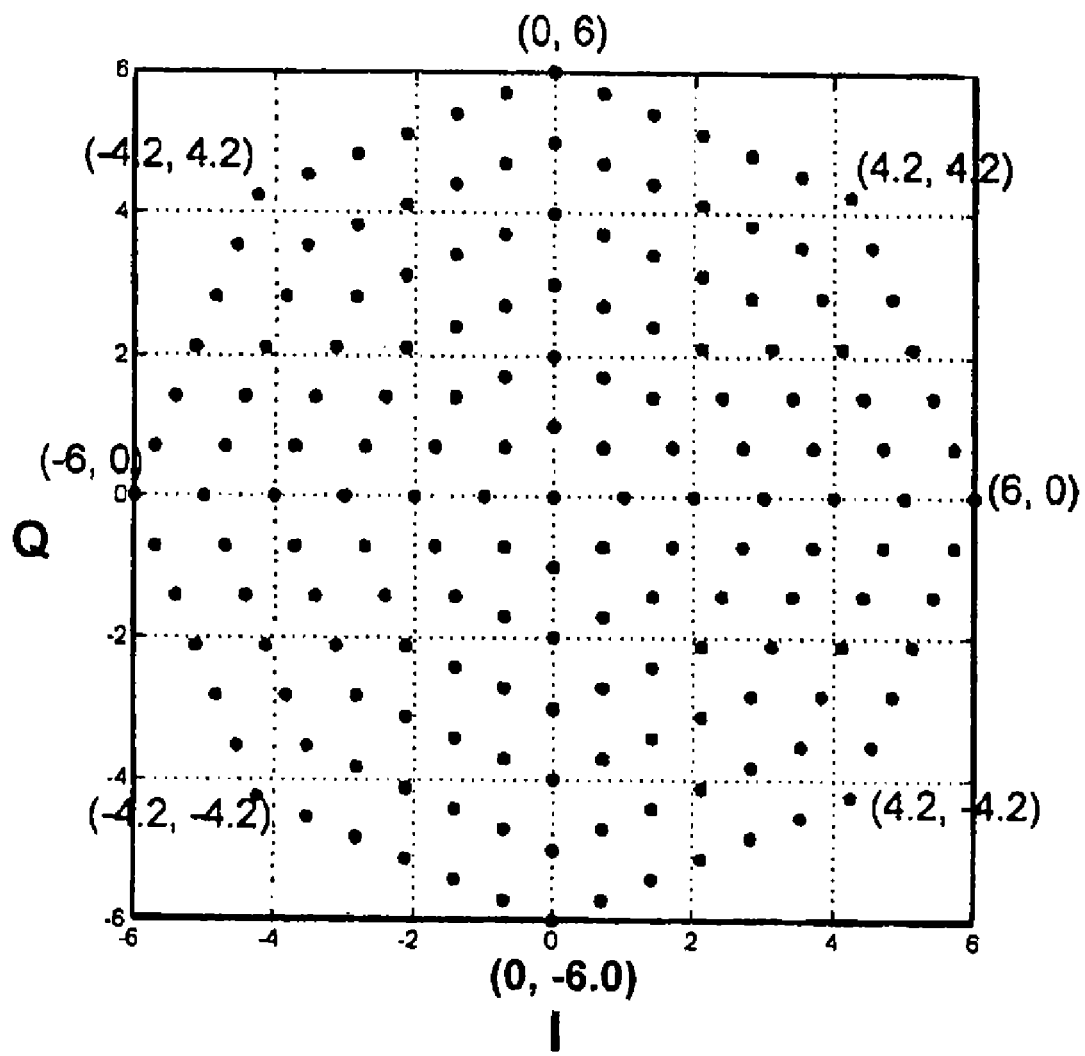
FIG. 39 is a map of a segment for an arbitrary-weight quantization map according to an embodiment of the present invention.
Figure 41:
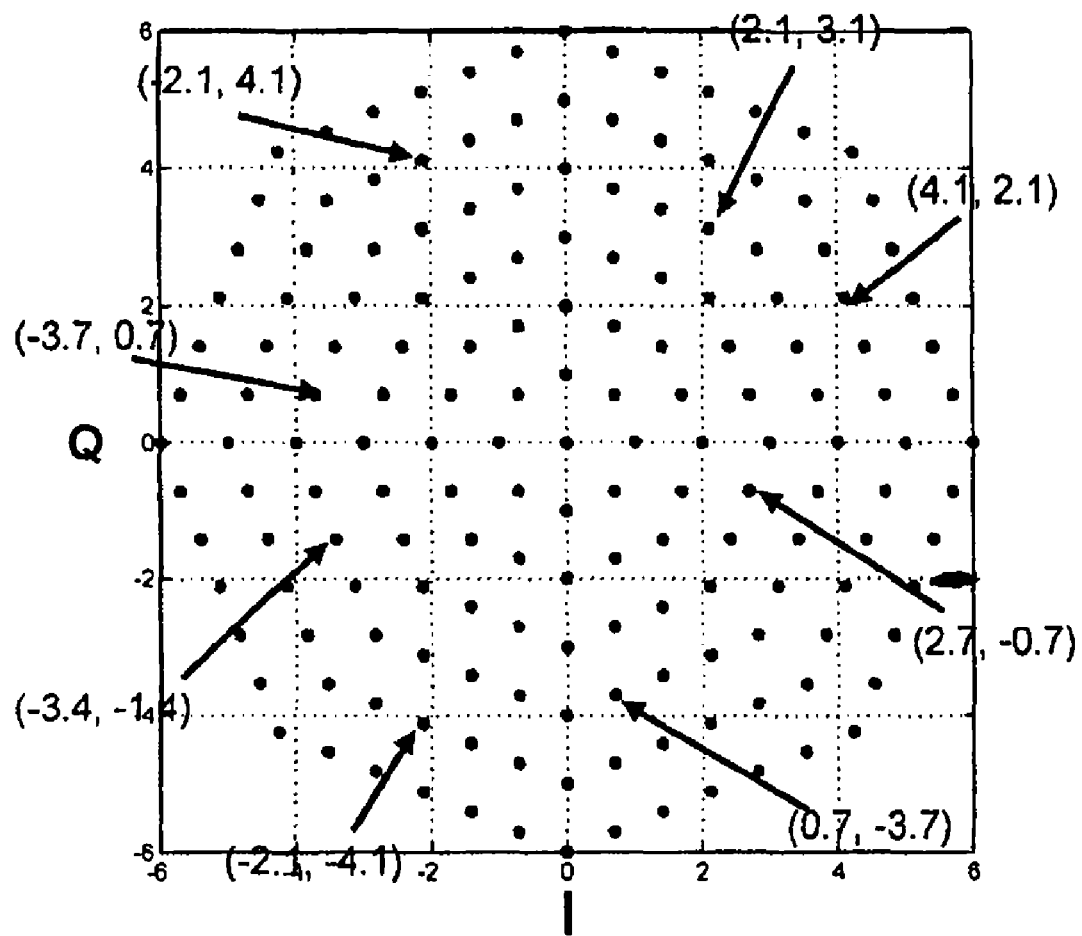
FIG. 41 is a map of a segment for an arbitrary-weight quantization map according to an embodiment of the present invention.

FIGS. 36, 38, and 40 depict three arbitrary-weight quantization tables which correspond to points shown in the maps of FIGS. 37, 39, and 41, respectively. Although the arbitrary-weight quantization tables are split into three tables, they can all be combined into a single table. Furthermore, although the three arbitrary-weight quantization tables indicate only 25 quantization points and their corresponding control signals, all of the quantization points can be indicated in one or more arbitrary-weight quantization tables.

The arbitrary-weight quantization tables list the quantization point and the corresponding values of the control signals. For example, for the quantization point (6,0), the corresponding value of the control signals should be C_1=1, C_2=1, C_3=1, and C_4=1 as indicated FIG. 36. Using the control signal table shown in FIG. 35, the control signals indicate that the phase selector 116a should output a waveform with having a 0° phase, the phase selector 116b should output a waveform having a 0° phase, the phase selector 116c should output a waveform having a 0° phase, and the phase selector 116d should output a waveform having a 0° phase Likewise, for the quantization point (4.2, 4.2), the value of the control signals should be C_1=2, C_2=2, C_3=2, and C_4=2 as indicated in FIG. 36. Using the control signal table shown in FIG. 35, the control signals indicate that the phase selector 116a should output a waveform having a θ phase, the phase selector 116b should output a waveform having a θ phase, the phase selector 116c should output a waveform having a θ phase, and the phase selector 116d should output a waveform having a θ phase. The same analysis can be performed for any of the quantization points in the arbitrary-weight quantization tables shown in FIG. 38 and FIG. 40. The outputted waveforms having the indicated phases will cause the DPAs 118a-118d to output power signals at a carrier frequency with the corresponding phases. The combiner 120 (FIG. 2) will combine the power signals to form an output signal which is an approximation of the baseband signals I_bb and Q_bb, but at the carrier frequency. Although the above example uses a quantization table to determine the value of the control signals sent to each of the phase selectors, the methods for determining the value of the control signals are not limited to using the quantization table described above. Any other acceptable method can be used.

Advantageously the use of arbitrary-weight mapping uses the same DPA 118 size as linear PA solutions. Also, depending on the weights assigned to the DPAs, for every doubling in the number of DPAs 118, there may be a 6 dB improvement in power spectral density, which is a 6 dB reduction in noise. Furthermore, the smaller the θ, the greater the number of quantization points, and the lower the average Euclidian Distance between the quantization points and the noise shaped baseband signal produced by the noise shaper 128. By correlation there is a more accurate representation of the baseband signal.

Figure 42:
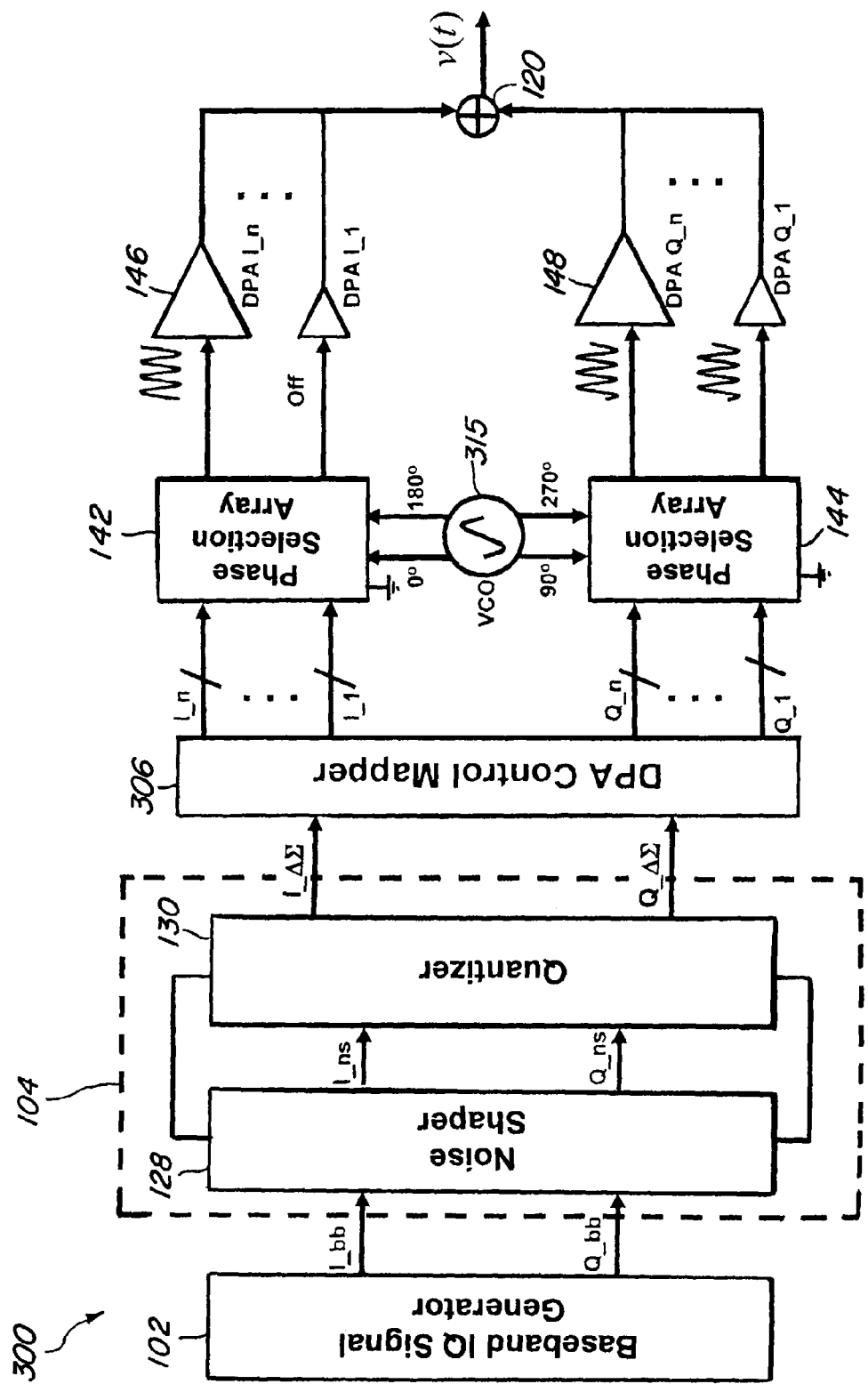
FIG. 42 is a schematic diagram of a transmitter according to another embodiment of the present invention.

FIG. 42 depicts a transmitter 300 according to another embodiment of the present invention. As seen in FIG. 42, the quantized signals I_ΔΣ and Q_ΔΣ are separately converted to the carrier frequency. The DPA control mapper 106 is replaced by a DPA control mapper 306. The DPA control mapper 306 receives the quantized signals I_ΔΣ and Q_ΔΣ and generates two sets of control signals, I_1-I_n and Q_1-Q_n. The phase selection array 108 is replaced by the phase selection array 142 and the phase selection array 144. Furthermore, the DPAs 118 are replaced by the DPAs 146 and 148.

The phase selection array 142 receives the control signals I_1-I_n and outputs either an inactive signal or a plurality of waveforms at a carrier frequency having a phase θ. The waveforms from the phase selection array 142 are received by the DPAs 146. In response to the inactive signal or the plurality of waveforms from the phase selection array 142, the DPAs 146 output a plurality of power signal outputs with waveforms having phases corresponding to the phases of the control signals. The oscillator 115 is replaced by the oscillator 315 and the phases output by the oscillator 315 can be limited to a small subset specific to the mapping technique. For example, for grid mapping the phases can be either 0°, 90°, 180°, or 270°. The combined power signal from the DPAs 146 reproduces the quantized signal I_ΔΣ and approximates the baseband signal I_bb, but at the carrier frequency.

The phase selection array 144 receives the control signals Q_1-Q_n and outputs either an inactive signal or a plurality of waveforms at a carrier frequency having a phase θ. The waveforms from the phase selection array 144 are received by the DPAs 148. In response to the inactive signal or the plurality of waveforms from the phase selection array 144, the DPAs 148 output a plurality of power signal outputs with waveforms having phases corresponding to the phases of the control signals. The combined power signal from the DPAs 148 reproduces the quantized signal Q_ΔΣ and approximates the baseband signal Q_bb, but at the carrier frequency. The transmitter 300 can be used, for example, for mapping techniques where separation of the I_bb and Q_bb signals are desirable, such as for grid mapping.

Figure 43:
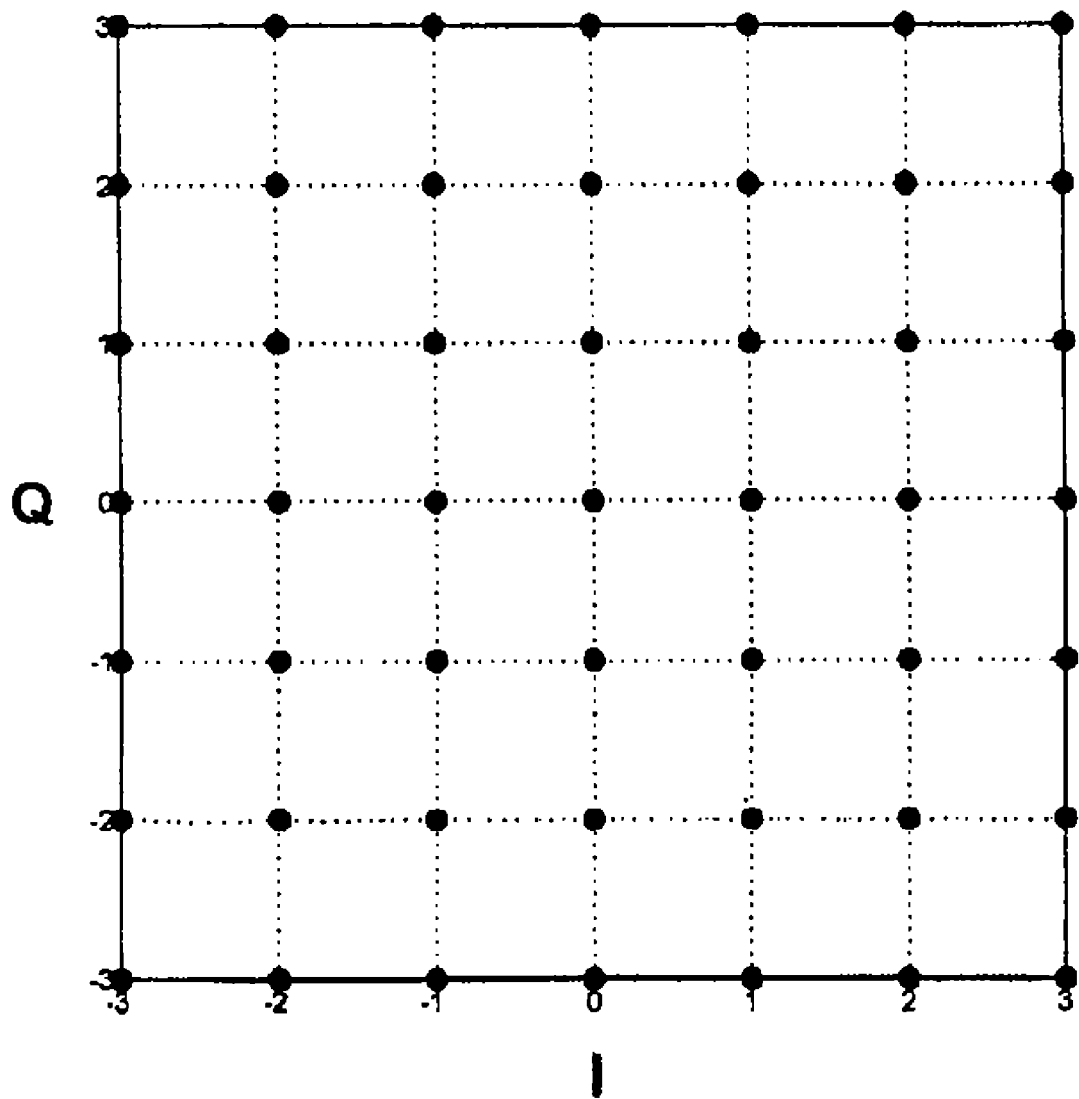
FIG. 43 is a map of a grid quantization map according to an embodiment of the present invention.

As seen in FIG. 43, quantization points can be mapped using grid mapping to develop a grid mapping quantization map. The grid mapping quantization map may be used, for example, by the transmitter 300 and more specifically, the quantizer 130 during grid mapping. In grid mapping, the quantization points are arranged in a grid-like manner such that lines can be drawn connecting the quantization points to form a grid. In grid mapping, the I_ΔΣ values approximate the X value in a Cartesian coordinate system while the Q_ΔΣ values approximate the Y value in the Cartesian coordinate system. For grid mapping, as shown in FIG. 42, the DPAs 146 and 148 are also binary weighted. However, the DPAs 146 and 148 can also be equal-weighted and/or arbitrary-weighted.

FIG. 44 depicts a control signal table for grid mapping used by the DPA control mapper 306 and/or the phase selectors in the phase selection array 142 to code or decode the values of the control signals I_1 to I_n. For example, a control signal having a value 0 indicates that the phase selector should output an inactive signal. However, a control signal having a value 1 indicates that the phase selector should output a waveform at a carrier frequency having a phase of 0°. Furthermore the control signals having a value of 2 indicates that the phase selector should output a waveform at a carrier frequency having a phase 180°.

FIG. 45 depicts a grid mapping quantization table for the DPA control mapper 306 and/or the phase selection array 142. In FIG. 45, $a_1$ to $a_n$ is the binary representation of the quantized value for the input absolute value of I_ΔΣ. Each $a_k$ can be either 0 or 1. When $a_k$ is equal to 0, the output I_k for a phase selector in the phase selection array 142 should be an inactive signal. However, when $a_k$ is equal to 1 and the value of I_ΔΣ is positive, the phase selector output should be a waveform at a carrier frequency having a phase of 0°. Likewise, when $a_k$ is equal to 1 and the value of I_ΔΣ is negative, the phase selector output should be a waveform at a carrier frequency having a phase of 180°.

FIG. 46 depicts a control signal table for grid mapping used by the DPA control mapper 306 and/or the phase selectors in the phase selection array 144 to code or decode the values of the control signals Q_1 to Q_n. For example, a control signal having a value 0 indicates that the phase selector should output an inactive signal. However, a control signal having a value 1 indicates that the phase selector should output a waveform at a carrier frequency having a phase of 90°. Furthermore the control signals having a value of 2 indicates that the phase selector should output a waveform at a carrier frequency having a phase 270°.

FIG. 47 depicts a grid mapping quantization table for the DPA control mapper 306 and/or the phase selection array 144. In FIG. 47, $b_1$ to $b_n$ is the binary representation of the quantized value for the input absolute value of Q_ΔΣ. Each $b_k$ can be either 0 or 1. When $b_k$ is equal to 0, the output Q_k, for a phase selector in the phase selection array 144 should be an inactive signal. However, when $b_k$ is equal to 1 and the value of Q_ΔΣ is positive, the phase selector output should be a waveform at a carrier frequency having a phase of 90°. Likewise, when $b_k$ is equal to 1 and the value of Q_ΔΣ is negative, the phase selector output should be a waveform at a carrier frequency having a phase of 270°. Although the above example uses a quantization table to determine the value of the control signals sent to each of the phase selectors, the methods for determining the value of the control signals are not limited to using the quantization table described above. Any other acceptable method can be used.

Figure 48:
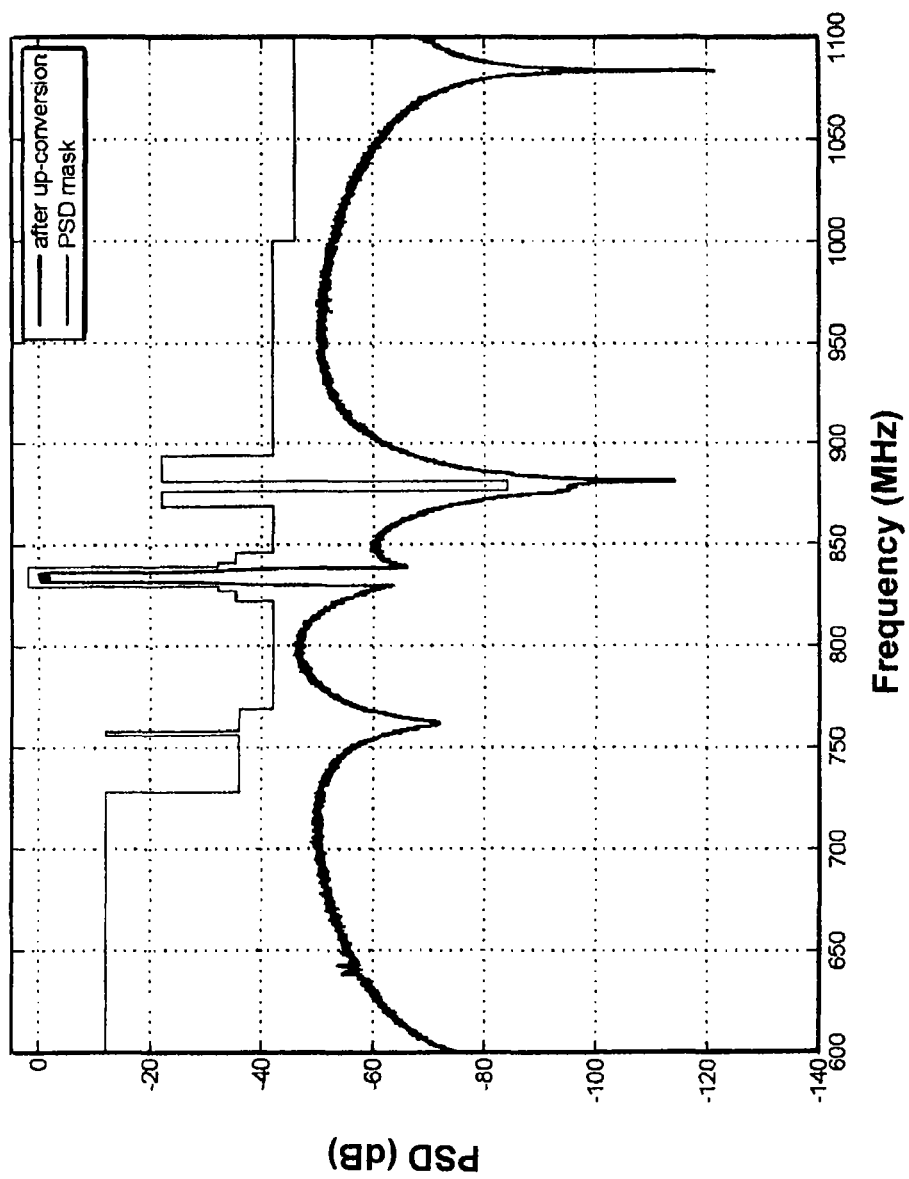
FIG. 48 is a PSD graph for a transmitter according to an embodiment of the present invention.

FIG. 48 is a PSD graph for the output signal of the transmitter 300 using the grid mapping. In FIG. 48, the PSD for a Band 5 LTE signal at a carrier frequency of 834 MHz with 6 DPAs is shown as the line labeled "after up-conversion." As can be seen, the PSD is below the PSD mask, which can be, for example, a PSD mask according to a guideline. The guideline can be, for example, a guideline from any organization such as the 3GPP. Thus, the transmitter 300 can operate within the guidelines set by the 3GPP. The guideline an also be a guidelines, for example, from a governmental agency such as the FCC.

Advantageously the use of grid mapping uses a relatively non-intensive quantization algorithm to produce the quantization map and the quantization table. Also, for every additional DPAs of binary weight added to the DPAs 146 and 148, there is a 6 dB improvement in power spectral density, which is a 6 dB reduction in noise. Furthermore, the grid mapping uses a relatively non-complex input drive stage for each DPAs 146 and 148.

With the present invention, the mapping technique can be selected according to a desire for noise reduction, manufacturing costs, and/or processing power required to implement the mapping technique. Furthermore, although only examples for equal-weight mapping, binary-weight mapping, arbitrary-weight mapping, and/or grid mapping are disclosed, any other type of mapping techniques may be used in order to achieve a high-efficiency transmitter which is not susceptible to the mismatch problems from a supply modulator.

Those of ordinary skill would appreciate that the various illustrative logical blocks, modules, and algorithm steps described in connection with the examples disclosed herein may be implemented as electronic hardware, computer software, or combinations of both. Furthermore, the present invention can also be embodied on a machine readable medium causing a processor or computer to perform or execute certain functions.

To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosed apparatus and methods.

The various illustrative logical blocks, units, modules, and circuits described in connection with the examples disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the examples disclosed herein may be embodied directly in hardware, in a software module executed by a processor, or in a combination of the two. The steps of the method or algorithm may also be performed in an alternate order from those provided in the examples. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an Application Specific Integrated Circuit (ASIC). The ASIC may reside in a wireless modem. In the alternative, the processor and the storage medium may reside as discrete components in the wireless modem.

The previous description of the disclosed examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The described embodiments are to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A transmitter comprising:
    a signal processor for receiving a baseband signal and generating a first quantized signal and a second quantized signal;
    a mapper for receiving the first quantized signal and the second quantized signal and generating a first plurality of control signals and a second plurality of control signals;
    a first phase selection array for receiving the first plurality of control signals and generating a first plurality of waveforms at a carrier frequency having a phase selected from multiple predetermined possible phases;
    a second phase selection array for receiving the second plurality of control signals and generating a second plurality of waveforms at the carrier frequency having a phase selected from multiple predetermined possible phases;
    a digital power amplifier array for receiving the first plurality of waveforms at the carrier frequency and the second plurality of waveforms at the carrier frequency, and generating an output signal; and
    an oscillator connected to the first phase selection array and the second phase selection array, the oscillator generating multiple phase signals, and
    wherein the first phase selection array includes a first plurality of phase selectors, each of the first plurality of phase selectors receiving the multiple phase signals and one of the first plurality of control signals, and either outputting an inactive signal, or one of the first plurality of waveforms at the carrier frequency having a phase corresponding to one of the multiple phase signals, based on the one of the first plurality of control signals, and
    the second phase selection array includes a second plurality of phase selectors, each of the second plurality of phase selectors receiving the multiple phase signals and one of the second plurality of control signals, and either outputting an inactive signal, or one of the second plurality of waveforms at the carrier frequency having a phase corresponding to one of the multiple phase signals, based on the one of the second plurality of control signals.

2. The transmitter of claim 1 wherein the digital power amplifier array comprises:
    a first plurality of digital power amplifiers each receiving one of the first plurality of waveforms at the carrier frequency and generating a power signal,
    a second plurality of digital power amplifiers each receiving one of the second plurality of waveforms at the carrier frequency and generating a power signal, and
    a combiner for combining the plurality of power signals from the first plurality of digital power amplifiers and the second plurality of digital power amplifiers to generate the output signal.

3. The transmitter of claim 1 wherein the multiple phase signals are orthogonal multiple phase signals.

4. The transmitter of claim 1 wherein the signal processor generates the quantized signal using a quantization map.

5. The transmitter of claim 4 wherein the quantization map is an equal-weight quantization map.

6. The transmitter of claim 4 wherein the quantization map is a binary-weight quantization map.

7. The transmitter of claim 4 wherein the quantization map is an arbitrary-weight quantization map.

8. The transmitter of claim 4 wherein the quantization map is a grid quantization map.

9. The transmitter of claim 1 wherein the mapper generates the plurality of control signals using a quantization table.

10. The transmitter of claim 9 wherein the quantization able is an equal-weight quantization table.

11. The transmitter of claim 9 wherein the quantization table is a binary-weight quantization table.

12. The transmitter of claim 9 wherein the quantization table is an arbitrary-weight quantization table.

13. The transmitter of claim 9 wherein the quantization table is a grid quantization table.

* * * * *